United States Patent
Komoto et al.

(10) Patent No.: US 12,244,947 B2
(45) Date of Patent: Mar. 4, 2025

(54) IMAGING ELEMENT AND IMAGING DEVICE

(71) Applicant: SONY SEMICONDUCTOR SOLUTIONS CORPORATION, Kanagawa (JP)

(72) Inventors: Takeyoshi Komoto, Kanagawa (JP); Takashi Tanaka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 17 days.

(21) Appl. No.: 18/253,323

(22) PCT Filed: Nov. 16, 2021

(86) PCT No.: PCT/JP2021/042106
§ 371 (c)(1),
(2) Date: May 17, 2023

(87) PCT Pub. No.: WO2022/113830
PCT Pub. Date: Jun. 2, 2022

(65) Prior Publication Data
US 2024/0031699 A1    Jan. 25, 2024

(30) Foreign Application Priority Data
Nov. 25, 2020    (JP) .................. 2020-195454

(51) Int. Cl.
*H04N 25/74*    (2023.01)
*H04N 25/59*    (2023.01)
*H04N 25/75*    (2023.01)

(52) U.S. Cl.
CPC ............. *H04N 25/74* (2023.01); *H04N 25/59* (2023.01); *H04N 25/75* (2023.01)

(58) Field of Classification Search
CPC ........ H04N 25/74; H04N 25/59; H04N 25/75; H04N 25/617; H01L 27/14609;
(Continued)

(56) References Cited

U.S. PATENT DOCUMENTS

| 2010/0140455 A1 | 6/2010 | Nathan et al. |
| 2016/0189614 A1* | 6/2016 | Tani ..................... G09G 3/3233 345/76 |

FOREIGN PATENT DOCUMENTS

| JP | 61-295656 A | 12/1986 |
| JP | 2006-108467 A | 4/2006 |

(Continued)

OTHER PUBLICATIONS

International Search Report and Written Opinion of PCT Application No. PCT/JP2021/042106, issued on Jan. 11, 2022, 08 pages of ISRWO.

*Primary Examiner* — Usman A Khan
(74) *Attorney, Agent, or Firm* — CHIP LAW GROUP

(57) ABSTRACT

Variation in electrostatic capacitances of control signal lines in a pixel is reduced. An imaging element includes: photoelectric conversion units arranged in a first semiconductor substrate; a charge holding unit that is disposed in the first semiconductor substrate and holds generated charges; a plurality of charge transfer units that is each disposed for one of the photoelectric conversion units and transfers the generated charges to the charge holding unit; an image signal generating circuit that is disposed in a second semiconductor substrate and generates an image signal on the basis of the held charge; a plurality of charge transfer unit signal lines that is each disposed for one of the plurality of charge transfer units and each transmits a control signal; a charge holding unit signal line that transmits a voltage corresponding to a charge held in the charge holding unit to the image signal generating circuit; and a capacitance adjustment unit (Continued)

that is disposed in the vicinity of at least one of the plurality of charge transfer unit signal lines and the charge holding unit signal line and adjusts an electrostatic capacitance between the charge transfer unit signal line and the charge holding unit signal line.

11 Claims, 23 Drawing Sheets

(58) Field of Classification Search
CPC ......... H01L 27/14634; H01L 27/14683; H01L 27/14636
USPC .......................................................... 348/308
See application file for complete search history.

(56) References Cited

FOREIGN PATENT DOCUMENTS

| | | |
|---|---|---|
| JP | 2012-227889 A | 11/2012 |
| WO | 2020/189534 A1 | 9/2020 |

\* cited by examiner

IMAGING ELEMENT AND IMAGING DEVICE

CROSS REFERENCE TO RELATED APPLICATIONS

This application is a U.S. National Phase of International Patent Application No. PCT/JP2021/042106 filed on Nov. 16, 2021, which claims priority benefit of Japanese Patent Application No. JP 2020-195454 filed in the Japan Patent Office on Nov. 25, 2020. Each of the above-referenced applications is hereby incorporated herein by reference in its entirety.

FIELD

The present disclosure relates to an imaging element and an imaging device.

BACKGROUND

Imaging elements, in which pixels that convert emitted incident light into an image signal are arranged in a two-dimensional lattice shape, are used. In this pixel, a photoelectric conversion element that performs photoelectric conversion of incident light is disposed. A plurality of image signals is generated on the basis of charges generated by photoelectric conversion of photoelectric conversion units in these pixels. An image for one screen can be captured by the plurality of image signals.

A charge holding unit and a charge transfer unit are further arranged in a pixel. The charge holding unit holds a charge generated by the photoelectric conversion unit. In addition, the charge transfer unit transfers the charge generated by the photoelectric conversion unit to the charge holding unit and transfers the charge by electrically connecting the photoelectric conversion unit and the charge holding unit. In a predetermined exposure period, photoelectric conversion based on incident light is performed in the photoelectric conversion unit, and after the lapse of the exposure period, a charge in the photoelectric conversion unit is transferred to the charge holding unit. Then, a next exposure period is started, and an image signal corresponding to the charge held in the charge holding unit is generated by the image signal generating circuit arranged in the pixel and is output from the pixel.

With advancement in the resolution of imaging elements, imaging elements in which the pixel size is reduced have been proposed. For example, there has been proposed an imaging element in which each pixel is downsized by sharing a charge holding unit and an image signal generating circuit by a plurality of photoelectric conversion units. In such an imaging element, transfer of charges generated by the photoelectric conversion units to the charge holding unit and generation of image signals are sequentially performed in the plurality of pixels, and a plurality of image signals is sequentially output.

In such an imaging element, variations in charge transfer among the photoelectric conversion units are problematic. This is because an error occurs in an image signal when a difference occurs in the amount of charge held in the charge holding unit due to variations in the charge transfer. The charge transfer in the charge transfer unit is controlled by a control signal. This control signal is supplied via a signal line wired for each pixel. When the control signal changes, variations occur in the charge transfer. For example, there are cases where a signal line is capacitively coupled with a signal line of another pixel to generate crosstalk, and the waveform of the control signal changes due to the influence of the crosstalk. In such a case, the conduction state between the photoelectric conversion unit and the charge holding unit described above changes and affects the charge transfer. Therefore, there is proposed an imaging device in which the influence of crosstalk is reduced by disposing another signal line between a signal line of a charge transfer unit of a pixel and a signal line of another pixel sharing a charge holding unit and an image signal generating circuit (see, for example, Patent Literature 1).

CITATION LIST

Patent Literature

Patent Literature 1: WO 2020/189534 A

SUMMARY

Technical Problem

However, in the above-described conventional technology, there is a problem that charge transfer varies in a case where a plurality of signal lines of pixels sharing a charge holding unit and an image signal generating circuit are arranged asymmetrically. Signal lines of a plurality of charge transfer units and a signal line wired to the charge holding unit are capacitively coupled. In a case where the plurality of signal lines is arranged asymmetrically with respect to the signal line wired to the charge holding unit, coupling capacitances (electrostatic capacitances) vary.

Therefore, the present disclosure proposes an imaging element and an imaging device that reduce variations in electrostatic capacitances of control signal lines of pixels sharing a charge holding unit and an image signal generating circuit.

Solution to Problem

An imaging element according to the present disclosure includes: a plurality of photoelectric conversion units that performs photoelectric conversion of incident light and generates a charge, the plurality of photoelectric conversion units arranged in a first semiconductor substrate having a first wiring region formed on a front surface side; a charge holding unit that holds the generated charges, the charge holding unit disposed in the first semiconductor substrate; a plurality of charge transfer units that transfers the generated charges to the charge holding unit, the plurality of charge transfer units each disposed for one of the photoelectric conversion units; an image signal generating circuit that generates an image signal on a basis of the held charge, the image signal generating circuit disposed in a second semiconductor substrate stacked on the first semiconductor substrate on a back surface side with a second wiring region formed on a front surface side; a plurality of charge transfer unit signal lines that each transmits a control signal, the plurality of charge transfer unit signal lines comprising wiring disposed in the second wiring region and wiring disposed in the first wiring region, the plurality of charge transfer unit signal lines each disposed for one of the plurality of charge transfer units; a charge holding unit signal line that transmits a voltage corresponding to a charge held in the charge holding unit to the image signal generating circuit, the charge holding unit signal line comprising wiring disposed in the second wiring region and wiring disposed in the first wiring region; and a capacitance adjustment unit that is disposed in a vicinity of at least one of the plurality of charge transfer unit signal lines and the charge holding unit signal line in the first wiring region and adjusts an electrostatic capacitance between the charge transfer unit signal line and the charge holding unit signal line.

DESCRIPTION OF EMBODIMENTS

Hereinafter, embodiments of the present disclosure will be described in detail on the basis of the drawings. Description will be given in the following order. Note that in each of the following embodiments, the same parts are denoted by the same symbols, and redundant description will be omitted.

1. First Embodiment
2. Second Embodiment
3. Third Embodiment
4. Fourth Embodiment
5. Fifth Embodiment
6. Application Examples to Imaging Device

1. First Embodiment

Configuration of Imaging Element

Figure 1:
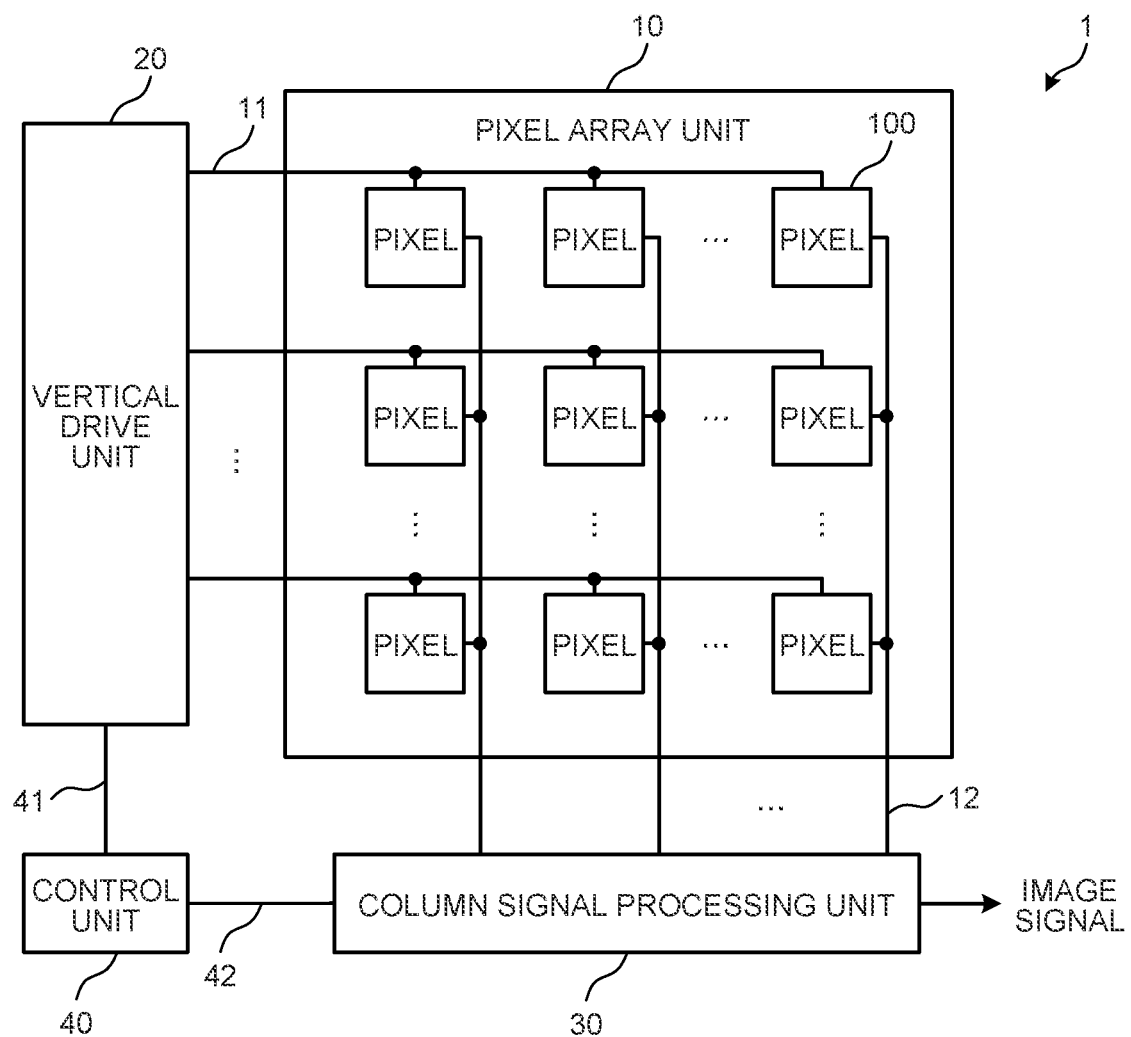
FIG. 1 is a diagram illustrating a configuration example of an imaging element according to an embodiment of the present disclosure.

FIG. 1 is a diagram illustrating a configuration example of an imaging element according to an embodiment of the present disclosure. The drawing is a block diagram illustrating a configuration example of an imaging element 1. The imaging element 1 is a semiconductor element that generates image data of a subject. The imaging element 1 includes a pixel array unit a vertical drive unit 20, a column signal processing unit and a control unit 40.

The pixel array unit 10 includes a plurality of pixels 100 arranged therein. The pixel array unit 10 in the drawing is an example in which the plurality of pixels 100 is arrayed in a shape of a two-dimensional matrix. Incidentally, a pixel 100 includes a photoelectric conversion unit that performs photoelectric conversion of incident light and generates an image signal of a subject on the basis of emitted incident light. For example, a photodiode can be used as the photoelectric conversion unit. Signal lines 11 and 12 are wired to each of the pixels 100. A pixel 100 is controlled by a control signal transmitted by a signal line 11 to generate an image signal and outputs the generated image signal via a signal line 12. Note that a signal line 11 is disposed for each of the rows shaping the two-dimensional matrix and is wired in a shared manner to a plurality of pixels 100 arranged in one row. A signal line 12 is disposed for each of the columns shaping the two-dimensional matrix and is wired in a shared manner to a plurality of pixels 100 arranged in one column.

The vertical drive unit 20 generates control signals for the pixels 100 described above. The vertical drive unit 20 in the drawing generates a control signal for each of the rows of the two-dimensional matrix of the pixel array unit 10 and sequentially outputs the control signals via a signal line 11.

The column signal processing unit 30 processes an image signal generated by a pixel 100. The column signal processing unit 30 in the drawing simultaneously processes image signals from a plurality of pixels 100 arranged in one row of the pixel array unit 10 transmitted via a signal line 12. As this processing, for example, analog-digital conversion for converting an analog image signal generated by a pixel 100 into a digital image signal or correlated double sampling (CDS) for removing an offset error of the image signal can be performed. The processed image signal is output to a circuit or the like outside the imaging element 1.

The control unit 40 controls the vertical drive unit 20 and the column signal processing unit 30. The control unit 40 in the drawing outputs control signals via each of signal lines 41 and 42 to control the vertical drive unit 20 and the column signal processing unit 30.

The imaging element 1 in the drawing includes three stacked semiconductor substrates (semiconductor substrates 120, 220 and 320). The pixel array unit 10 can be disposed on the semiconductor substrates 120 and 220. The vertical drive unit 20, the column signal processing unit 30, and the control unit 40 can be arranged on the semiconductor substrate 320. Details of the structure of the semiconductor substrate 120 and others will be described later. Note that the imaging element 1 in the drawing is an example of the imaging device described in the claims. Note that the pixel array unit 10 in the drawing is an example of the imaging element described in the claims. Furthermore, the vertical drive unit 20 in the drawing is an example of the control signal generating circuit described in the claims. In an, the column signal processing unit 30 in the drawing is an example of the processing circuit described in the claims.

Configuration of Pixel

Figure 2:
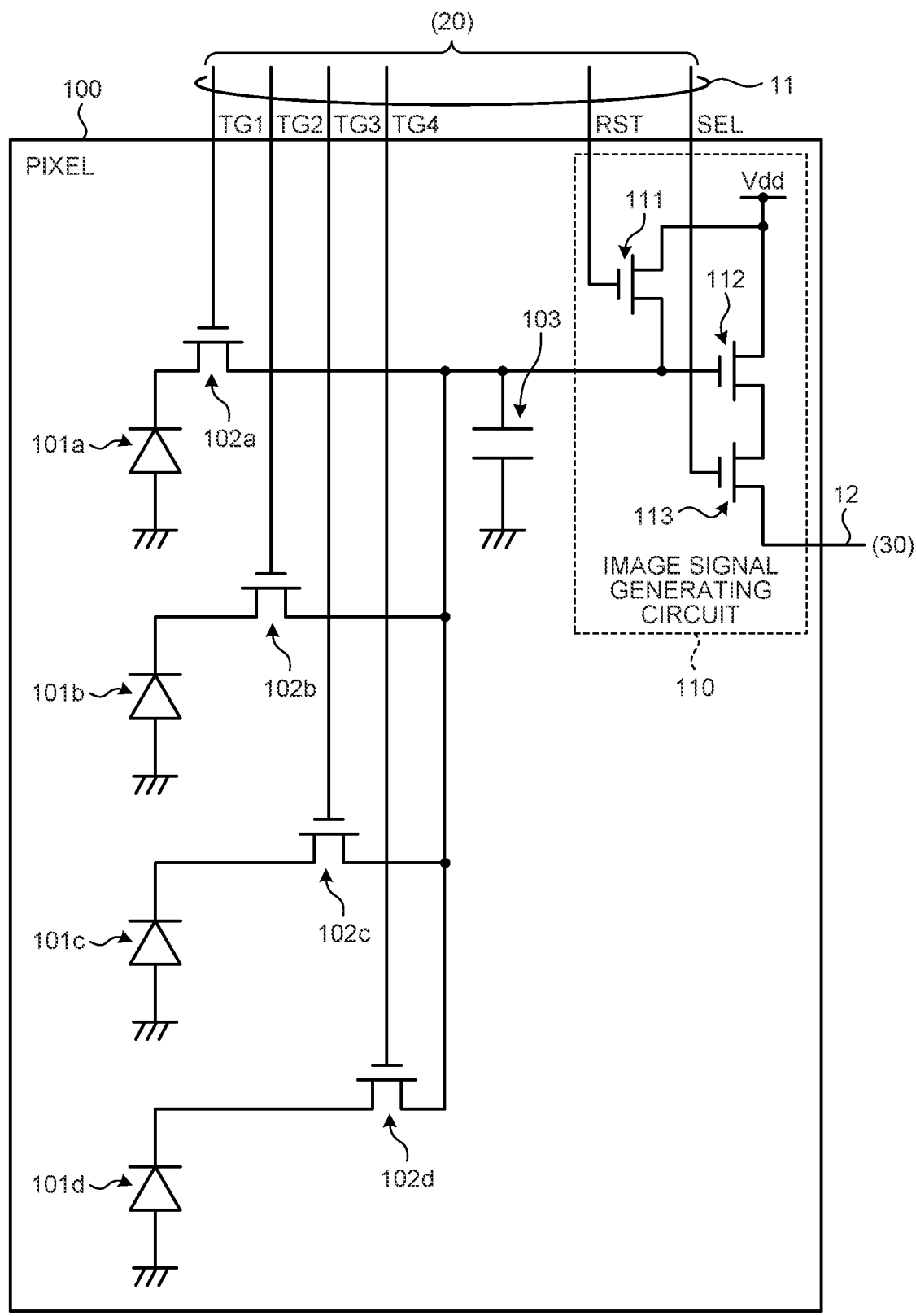
FIG. 2 is a diagram illustrating a configuration example of a pixel according to a first embodiment of the disclosure.

FIG. 2 is a diagram illustrating a configuration example of a pixel according to a first embodiment of the disclosure. The drawing is a circuit diagram illustrating a structure example of the pixels 100. A pixel 100 in the drawing includes photoelectric conversion units 101a, 101b, 101c, and 101d, charge transfer units 102a, 102b, 102c, and 102d, and an image signal generating circuit 110.

Furthermore, the image signal generating circuit 110 includes MOS transistors 111 to 113. The MOS transistors 111 to 113, the charge transfer units 102a, 102b, 102c, and 102d can include an n-channel MOS transistor.

As described above, signal lines 11 and 12 are wired to the pixel 100. The signal lines 11 in the drawing include a signal line TG1, a signal line TG2, a signal line TG3, a signal line TG4, a signal line RST, and a signal line SEL. In addition, a power supply line Vdd is wired to the pixel 100. The power supply line Vdd is wiring that supplies power to the pixel 100.

An anode of the photoelectric conversion unit 101a is grounded, and a cathode is connected to a source of the charge transfer unit 102a. An anode of the photoelectric conversion unit 101b is grounded, and a cathode is connected to a source of the charge transfer unit 102b. An anode of the photoelectric conversion unit 101c is grounded, and a cathode is connected to a source of the charge transfer unit 102c. An anode of the photoelectric conversion unit 101d is grounded, and a cathode is connected to a source of the charge transfer unit 102d. A drain of the charge transfer unit 102a, a drain of the charge transfer unit 102b, a drain of the charge transfer unit 102c, and a drain of the charge transfer unit 102d are connected to a gate of the MOS transistor 112 in a shared manner. The gate of the MOS transistor 112 is further connected with a source of the MOS transistor 111 and a first end of the charge holding unit 103. A second end of the charge holding unit 103 is grounded. A drain of the MOS transistor 111 and a drain of the MOS transistor 112 are connected to the power supply line Vdd in a shared manner. A source of the MOS transistor 112 is connected to a drain of the MOS transistor 113, and a source of the MOS transistor 113 is connected to the signal line 12.

The signal line TG1, the signal line TG2, the signal line TG3, and the signal line TG4 are connected to a gate of the charge transfer unit 102a, a gate of the charge transfer unit 102b, a gate of the charge transfer unit 102c, and a gate of the charge transfer unit 102d, respectively. The signal line RST and the signal line SEL are connected to a gate of the MOS transistor 111 and a gate of the MOS transistor 113, respectively.

The photoelectric conversion units 101a, 101b, 101c, and 101d perform photoelectric conversion of incident light. The photoelectric conversion units 101a, 101b, 101c, and 101d can include a photodiode formed in the semiconductor substrate 120 described later.

The charge holding unit 103 holds a charge. The charge holding unit 103 holds charges generated by photoelectric conversion by the photoelectric conversion units 101a, 101b, 101c, and 101d. The charge holding unit 103 can include a floating diffusion (FD) region which is a semiconductor region formed in the semiconductor substrate 120.

The charge transfer units 102a, 102b, 102c, and 102d transfer the charges generated by photoelectric conversion by the photoelectric conversion units 101a, 101b, 101c, and 101d to the charge holding unit 103. The charge transfer units 102a, 102b, 102c, and 102d transfer the charges of the photoelectric conversion units 101a, 101b, 101c, and 101d, respectively. Control signals of the charge transfer units 102a, 102b, 102c, and 102d are transmitted by signal lines TG1, TG2, TG3, and TG4, respectively. Applicable as this control signal is a pulse signal (hereinafter referred to as an ON signal) having a voltage exceeding a threshold value of a gate-source voltage Vgs of a MOS transistor included in the charge transfer unit 102a and others. By applying this ON signal to the gate of the charge transfer unit 102a and others, the charge transfer unit 102a and others can be made conductive.

The image signal generating circuit 110 generates an image signal on the basis of a charge held by the charge holding unit 103. As described above, the image signal generating circuit 110 includes the MOS transistors 111 to 113. As described later, the image signal generating circuit 110 is disposed in the semiconductor substrate 220.

The MOS transistor 111 resets the charge holding unit 103. This reset can be performed by discharging the charge of the charge holding unit 103 by electrically connecting the charge holding unit 103 and the power supply line Vdd. A control signal for the MOS transistor 111 is transmitted by the signal line RST. In addition, the gate of the MOS transistor 112 is connected to the charge holding unit 103. Therefore, an image signal having a voltage corresponding to the charge held in the charge holding unit 103 is generated at the source of the MOS transistor 112. Furthermore, the image signal can be output to the signal line 12 by making the MOS transistor 113 conductive. A control signal for the MOS transistor 113 is transmitted by the signal line SEL. The above ON signal can also be applied to the control signals of the MOS transistors 111 and 113.

Generation of image signals in the pixel 100 in the drawing can be performed as follows. First, the MOS transistor 111 is made conductive to reset the charge holding unit 103. At this point, the charge transfer units 102a, 102b, 102c, and 102d are further made conductive. As a result, charges of the photoelectric conversion units 101a, 101b, 101c, and 101d are discharged, and the photoelectric conversion units 101a, 101b, 101c, and 101d are reset. After completion of this reset, application of an ON signal to the MOS transistor 111 and the charge transfer units 102a, 102b, 102c, and 102d is stopped to bring the MOS transistor 111 and the charge transfer units 102a, 102b, 102c, and 102d into a non-conductive state. As a result, exposure is started.

After a predetermined exposure period elapses, the charge holding unit 103 is reset again by the MOS transistor 111. After completion of the reset, the charge transfer unit 102a is made conductive, and the charge of the photoelectric conversion unit 101a is transferred to the charge holding unit 103 and held therein. An image signal corresponding to the held charge is generated by the MOS transistor 112. Next, by making the MOS transistor 113 conductive, the image signal based on the photoelectric conversion by the photoelectric conversion unit 101a can be output to the signal line 12.

Next, the procedure from the resetting of the charge holding unit 103 to the output of the image signal is sequentially performed on the charge transfer units 102b, 102c, and 102d. As a result, image signals based on the photoelectric conversion by the photoelectric conversion units 101b, 101c, and 101d can be sequentially output to the signal line 12.

When the charge transfer units 102a and others transfer the charges of the photoelectric conversion units 101a and others to the charge holding unit 103, an ON signal is applied to the charge transfer units 102a, 102b, 102c, and 102d via the signal lines TG1, TG2, TG3, and TG4. By application of these ON signals, the charge transfer units 102a, 102b, 102c, and 102d enter a conduction state, and the charges are transferred. In a case where there is a difference in the conduction states of the charge transfer units 102a, 102b, 102c, and 102d, variations occur in the charge transfer from the photoelectric conversion units 101a and others. For example, the time required for charge transfer varies, and the sensitivity varies for each of the photoelectric conversion units 101a, 101b, 101c, and 101d. As a result, an error occurs in the image signals.

The variation in the conduction state in each of the charge transfer units 102a, 102b, 102c, and 102d is caused by, for example, a variation in the ON signal, that is, the control signal. This variation in the control signal is caused by, for example, a variation in wiring capacitances of the signal lines TG1, TG2, TG3, and TG4 that transmit the control signals. This is because variations in the wiring capacitances cause variations in the waveform of control signals, which changes the conduction states of the charge transfer units 102a and others. Furthermore, for example, also in a case where the capacitance between the signal line TG1 and others and drains of MOS transistors included in the charge transfer unit 102a and others to which the respective signal lines are connected varies, the conduction states of the charge transfer unit 102a and others change. This is because the potential immediately below the gate of the charge transfer unit 102a and others changes as described later.

As described above, in order to reduce variations in charge transfer by the charge transfer units 102a, 102b, 102c, and 102d, it is necessary to make the wiring capacitances and others of the signal lines TG1, TG2, TG3, and TG4 uniform. Therefore, it is necessary to completely match the arrangement of the signal lines TG1, TG2, TG3, and TG4 with respect to the semiconductor substrate. However, it is difficult to completely match the arrangement of the signal lines TG1, TG2, TG3, and TG4. This is because there are constraints in the layout in the semiconductor substrate 120. Therefore, in the pixels 100 of the present disclosure, variations are reduced by adjusting the wiring capacitances of the signal lines TG1, TG2, TG3, and TG4. By disposing a capacitance adjustment unit 130 described later, the wiring capacitances of the signal lines TG1, TG2, TG3, and TG4 can be adjusted.

Planar Structure of Pixel

Figure 3:
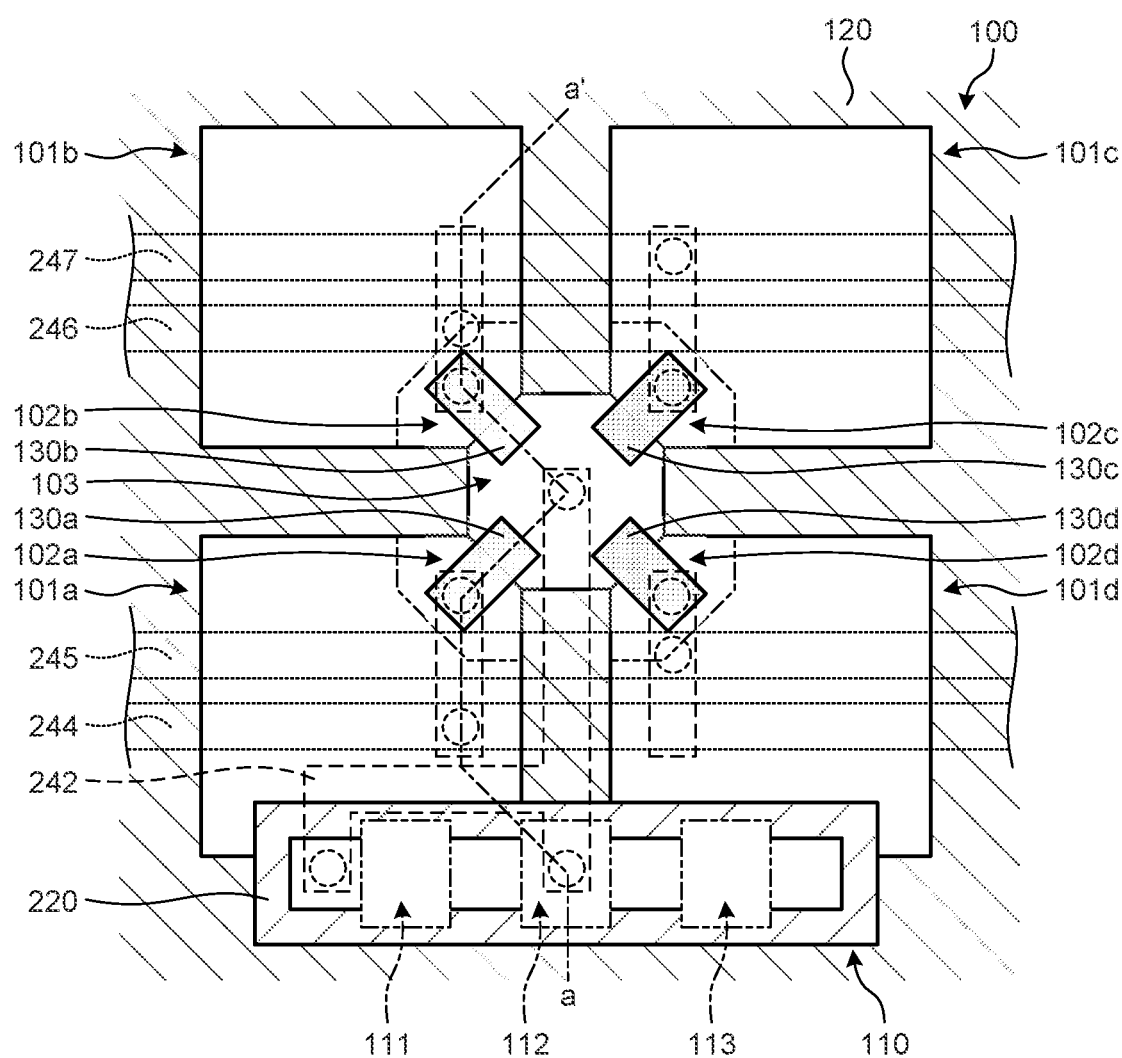
FIG. 3 is a plan view illustrating a structure example of a pixel according to the first embodiment of the disclosure.

FIG. 3 is a plan view illustrating a structure example of a pixel according to the first embodiment of the disclosure. The drawing is a plan view illustrating the configuration example of the pixel 100. As described above, the pixel array unit 10 includes the semiconductor substrates 120 and 220. In the drawing, the semiconductor substrates 120 and 220 are illustrated. The semiconductor substrate 120 is disposed in a first layer, in which the photoelectric conversion units 101a, 101b, 101c, and 101d, the charge transfer units 102a, 102b, 102c, and 102d, and the charge holding unit 103 of the pixel 100 are formed. The semiconductor substrate 220 is disposed in a second layer, in which the image signal generating circuit 110 is formed.

Hatched regions in the drawing represent the semiconductor substrates (semiconductor substrates 120 and 220). A white rectangle represents a semiconductor region formed in the semiconductor substrate. A polygon of a two-dot chain line represents a gate electrode of a MOS transistor. Rectangles hatched with dots represent capacitance adjustment units 130a, 130b, 130c, and 130d. A region of a dotted line represents wiring disposed in the semiconductor substrate 120. A region of a broken line represents wiring disposed in the semiconductor substrate 220. A dotted circle represents a via plugs and a contact plug. Details of the above will be described later.

In the semiconductor substrate 120, the photoelectric conversion units 101a, 101b, 101c, and 101d are arranged in two rows and two columns. The charge holding unit 103 is disposed at the center among the photoelectric conversion units 101a, 101b, 101c, and 101d. The charge transfer units 102a, 102b, 102c, and 102d are arranged between the photoelectric conversion units 101a, 101b, 101c, and 101d and the charge holding unit 103, respectively.

The image signal generating circuit 110 of the semiconductor substrate 220 is disposed at a position where a part thereof overlaps the photoelectric conversion units 101a and 101d. As illustrated in the drawing, in the image signal generating circuit 110, the MOS transistors 111 to 113 are arranged side by side.

Wiring 244 of the semiconductor substrate 220 corresponds to the signal line TG1 described in FIG. 2 and is connected to a gate electrode of the charge transfer unit 102a via a contact plug and wiring of the semiconductor substrate 120. Similarly, wiring 246 corresponds to the signal line TG2 and is connected to a gate electrode of the charge transfer unit 102b. Wiring 247 corresponds to the signal line TG3 and is connected to a gate electrode of the charge transfer unit 102c. Wiring 245 corresponds to the signal line TG4 and is connected to a gate electrode of the charge transfer unit 102d. Meanwhile, wiring 242 of the semiconductor substrate 220 is connected to the charge holding unit 103, a gate electrode of the MOS transistor 112, and a source region of the MOS transistor 111 via contact plugs. For convenience, description of other pieces of wiring and the like is omitted.

The wiring 244 connected to the charge transfer unit 102a and the wiring 245 connected to the charge transfer unit 102d in the drawing have larger wiring capacitance than the wiring 246 connected to the charge transfer unit 102b and the wiring 247 connected to the charge transfer unit 102c. This is due to the proximity to the wiring 242. Therefore, the capacitance adjustment units 130a, 130b, 130c, and 130d are arranged to correct the wiring capacitances. Specifically, the capacitance adjustment units 130b and 130c adjust and increase the wiring capacitances of the wiring 246 and 247.

[Structure of Cross-Section of Pixel]

Figure 4:
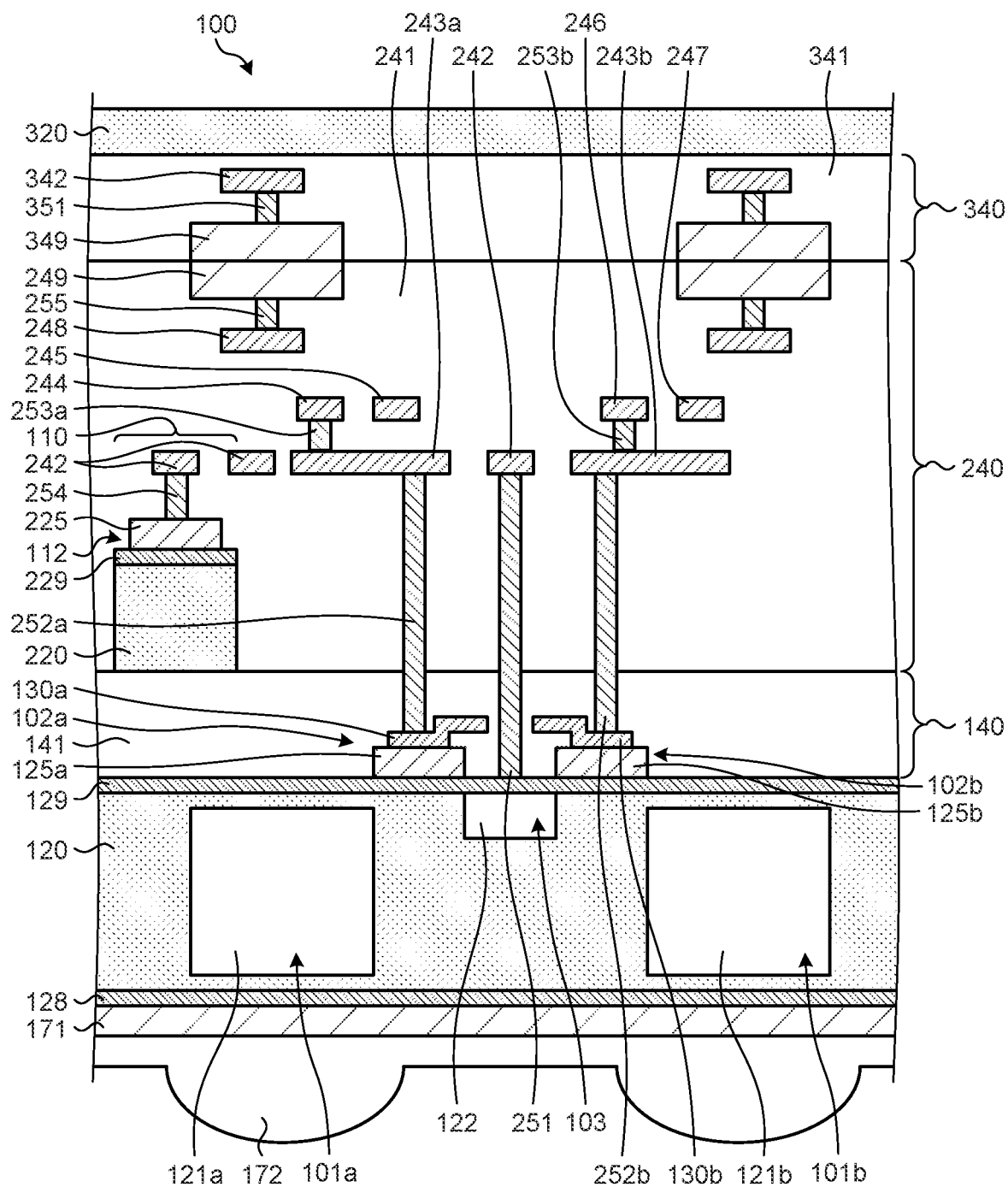
FIG. 4 is a cross-sectional view illustrating a structure example of a pixel according to the first embodiment of the disclosure.

FIG. 4 is a cross-sectional view illustrating a structure example of a pixel according to the first embodiment of the disclosure. The drawing illustrates a simplified structure of a cross section of the pixel 100 and is a cross-sectional view taken along line a-a' in FIG. 3. As illustrated in the drawing, the imaging element 1 includes the semiconductor substrates 120, 220, and 320 sequentially stacked. Among them, the pixel 100 is disposed in the semiconductor substrates 120 and 220. The pixel 100 includes the semiconductor substrates 120 and 220, insulating films 128, 129, and 229, wiring regions 140 and 240, the capacitance adjustment unit 130, a color filter 171, and an on-chip lens 172.

The semiconductor substrate 120 is a semiconductor substrate in which diffusion regions of a photoelectric conversion unit 101 (photoelectric conversion units 101a, 101b, 101c, and 101d), the charge holding unit 103, and a charge transfer unit 102 (charge transfer units 102a, 102b, 102c, and 102d) of the pixel 100 are formed. The semiconductor substrate 120 can be made of silicon (Si). In the drawing, the photoelectric conversion units 101a and 101b, the charge holding unit 103, and the charge transfer units 102a and 102b are illustrated. The diffusion regions of these elements are formed in a well region formed in the semiconductor substrate 120. For convenience, it is based on the premise that the semiconductor substrate 120 in the drawing includes a p-type well region. An element can be disposed by forming an n-type or p-type semiconductor region in the p-type well region. A white rectangle illustrated in the semiconductor substrate 120 represents an n-type semiconductor region. In the drawing, n-type semiconductor regions 121a, 121b, and 122 are illustrated.

The photoelectric conversion unit 101a includes the n-type semiconductor region 121a. Specifically, a photodiode including a p-n junction at an interface between the n-type semiconductor region 121a and the surrounding p-type well region corresponds to the photoelectric conversion unit 101a. In the photoelectric conversion unit 101a, electrons of charges generated by photoelectric conversion are accumulated in the n-type semiconductor region 121a and transferred by the charge transfer unit 102a. Similarly, the photoelectric conversion unit 101b includes the n-type semiconductor region 121b.

The charge holding unit 103 includes the n-type semiconductor region 122. The n-type semiconductor region 122 is a semiconductor region having a relatively high impurity concentration and corresponds to the above-described FD.

The charge transfer unit 102a includes the n-type semiconductor region 121a, the n-type semiconductor region 122, and a gate electrode 125a. In this case, the n-type semiconductor region 121a and the n-type semiconductor region 122 correspond to a source region and a drain region, respectively. Similarly, the charge transfer unit 102b includes the n-type semiconductor region 121b, the n-type semiconductor region 122, and a gate electrode 125b.

The insulating film 129 is disposed on a front surface of the semiconductor substrate 120 to insulate and protect the semiconductor substrate 120. The insulating film 129 can be made of, for example, silicon oxide ($SiO_2$). Note that the insulating film 129 immediately below the gate electrodes 125a and 125b corresponds to a gate insulating film.

The wiring region 140 is disposed on the front surface side of the semiconductor substrate 120 and is a region in which wiring is disposed. In the wiring region 140, an insulating layer 141 and contact plugs 251, 252a, and 252b described later are arranged. The insulating layer 141 insulates wiring such as the contact plug 251. The insulating layer 141 can be made of, for example, an insulating material such as $SiO_2$.

The capacitance adjustment units 130a and 130b are arranged in the vicinity of wiring for transmitting a control signal for the charge transfer unit 102 and wiring connected to the charge holding unit 103 and adjust electrostatic capacitance between these pieces of wiring. The capacitance adjustment unit 130a is formed into a shape that is connected to the contact plug 252a and approaches the contact plug 251. Likewise, the capacitance adjustment unit 130b is formed into a shape that is connected to the contact plug 252b and approaches the contact plug 251. Details of the configurations of the capacitance adjustment units 130a and 130b will be described later.

Note that a barrier layer 139 (not illustrated) can be disposed on a surface of the capacitance adjustment unit 130. The barrier layer 139 is a film that prevents diffusion of tungsten (W) contained in a contact plug 252 disposed in a later step into the capacitance adjustment unit 130. The barrier layer 139 can be made of, for example, a laminated film of titanium (Ti) and molybdenum (Mo) or titanium nitride (TiN).

The semiconductor substrate 220 is a substrate made of a semiconductor on which the image signal generating circuit 110 is disposed. The semiconductor substrate 220 is stacked on the semiconductor substrate 120. A back surface of the semiconductor substrate 220 is bonded to a front surface of the wiring region 140 of the semiconductor substrate 120, thereby making the semiconductor substrates 120 and 220 to be stacked. Similarly to the semiconductor substrate 120, the semiconductor substrate 220 can be made of Si. As described in FIG. 3, the MOS transistors 111 to 113 included in the image signal generating circuit 110 are arranged on the semiconductor substrate 220. In the drawing, the MOS transistor 112 is illustrated. A gate electrode 225 of the MOS transistor 112 is disposed on the semiconductor substrate 220 in the drawing. In addition, the insulating film 229 is disposed on a front surface of the semiconductor substrate 220. The insulating film 229 immediately below the gate electrode 225 corresponds to a gate insulating film.

Note that the semiconductor substrate 220 in the drawing illustrates an example in which a region of the image signal generating circuit 110 is disposed in an island shape. A region other than the region of the image signal generating circuit 110 of the semiconductor substrate 220 is removed by etching. An insulating layer 241 to be described later is disposed in the region removed by the etching.

The wiring region 240 is disposed on a front surface side of the semiconductor substrate 220. The wiring region 240 includes wiring (wiring 242, 243*a*, 243*b*, and 244 to 248), contact plugs (contact plugs 251, 252*a*, 252*b*, and 254), via plugs (via plugs 253*a*, 253*b*, and 255), and the insulating layer 241. The wiring region 240 further includes a pad 249.

Similarly to the insulating layer 141, the insulating layer 241 insulates wiring and others. The insulating layer 241 can be made of, for example, SiO$_2$.

The wiring 242, 243*a*, 243*b*, and 244 to 248 transmit signals and the like to the elements of the pixel 100. The wiring 242, 243*a*, 243*b*, and 244 to 248 can be made of metal such as copper (Cu) or W. In addition, the wiring 242 and others and the insulating layer 241 can be multiple layers. This drawing illustrates a case where the insulating layer 241 and the wiring are formed in three layers. The wiring 242, 243*a*, and 243*b* is included in a first wiring layer, the wiring 244 to 247 is included in a second wiring layer, and the wiring 248 is included in a third wiring layer. Note that the wiring 242 illustrated in a divided state in the drawing is included in a single piece of wiring as described in FIG. 3.

The contact plugs 251, 252*a*, 252*b*, and 254 electrically connect wiring and a semiconductor substrate. The contact plug 251 connects the wiring 242 and the semiconductor region 122 of the semiconductor substrate 120. The contact plug 252*a* connects the wiring 243*a* and the gate electrode 125*a*, and the contact plug 252*b* connects the wiring 243*b* and the gate electrode 125*b*. The contact plugs 252*a* and 252*b* in the drawing connect the wiring 243*a* and 243*b* and the gate electrodes 125*a* and 125*b* via the capacitance adjustment units 130*a* and 130*b*, respectively. The contact plug 254 connects the wiring 242 and the gate electrode 225 of the semiconductor substrate 220. The contact plugs 251, 252*a*, 252*b*, and 254 can be made of, for example, W or the like in a columnar shape.

The via plugs 253*a*, 253*b*, and 255 electrically connect pieces of wiring arranged in different layers. The via plug 253*a* connects the wiring 243*a* and the wiring 244, and the via plug 253*b* connects the wiring 243*b* and the wiring 246. Incidentally, the via plug 255 connects the wiring 248 and the pad 249.

The pad 249 is a conductor that transmits a signal to another semiconductor substrate to be bonded. The pad 249 in the drawing is bonded to a pad 249 disposed in a wiring region 340 of the semiconductor substrate 320 and transmits a signal between the semiconductor substrates 220 and 320. The pad 249 can be made of Cu, for example.

The semiconductor substrate 320 is a semiconductor substrate in which circuits other than the pixel array unit 10 of the imaging element 1 are arranged. The semiconductor substrate 320 is stacked on the semiconductor substrate 220. A surface of the wiring region 340 of the semiconductor substrate 320 is bonded to a surface of the wiring region 240 of the semiconductor substrate 220, thereby making the semiconductor substrates 220 and 320 to be stacked. Similarly to the semiconductor substrate 120, the semiconductor substrate 320 can be made of Si.

The wiring region 340 includes wiring 342, a via plug 351, a pad 349, and an insulating layer 341.

The insulating film 128 is a film that is disposed on a back surface of the semiconductor substrate 120 to insulate and protect the semiconductor substrate 120. The insulating film 129 can be made of, for example, SiO$_2$.

The color filter 171 is an optical filter that transmits incident light having a predetermined wavelength among incident light. As the color filter 171, color filters 171 that transmit red light, green light, or blue light can be used.

The on-chip lens 172 condenses incident light. The on-chip lens 172 condenses incident light on the photoelectric conversion unit 101*a* or others.

As described above, in the pixel 100, the photoelectric conversion unit 101*a* and others are irradiated with incident light from the back surface side of the semiconductor substrate 120, and an image signal is generated. Such an imaging element is referred to as a back-illuminated imaging element.

Stacking the semiconductor substrates 120 and 220 can be performed by the following steps. First, the wiring region 140 is formed in the semiconductor substrate 120. Next, the front surface of the wiring region 140 and the back surface of the semiconductor substrate 220 are activated, overlaid, heated, and pressure-bonded. Thus, the semiconductor substrates 120 and 220 are bonded and stacked.

Then, the semiconductor substrate 220 is ground by chemical mechanical polishing (CMP) to be thinned. Next, a region other than the region of the image signal generating circuit 110 is removed by etching. Next, the region removed by etching is filled with the insulating layer 241. Next, a well region and a semiconductor region are formed in the semiconductor substrate 220, and the insulating film 229 and the gate electrode 225 are formed. Next, the insulating layer 241 is disposed on the front surface side of the semiconductor substrate 220. Next, an opening is formed in the insulating layer 241 in a region where the contact plug 252*a* and others are to be formed and filled with W, thereby arranging the contact plug 252*a* and others. Then, the wiring 242 of the first layer and the insulating layer 241 are stacked. Next, an opening is formed in the insulating layer 241 in a region where the via plug 253*a* and others are to be arranged and filled with Cu and others, thereby arranging the wiring 244 and others of the second layer. Arranging wiring and the insulating layer 241 is repeated as many layers as necessary, and the pad 249 is disposed on the surface.

Then, the semiconductor substrate 320, in which the wiring region 340 on which the pad 349 is disposed on the surface is formed, and the semiconductor substrate 220 are stacked. For this stacking, the surfaces of the wiring regions 240 and 340 are activated, overlaid, heated, and pressure-bonded. At this point, the pads 249 and 349 are aligned. As a result, the pad 249 and the pad 349 are electrically connected, and the semiconductor substrate 220 and the semiconductor substrate 320 are stacked.

Note that the semiconductor substrate 120 is an example of the first semiconductor substrate described in the claims. The wiring region 140 is an example of the first wiring region described in the claims. The semiconductor substrate 220 is an example of the second semiconductor substrate described in the claims. The wiring region 240 is an example of the second wiring region described in the claims.

[Structure of Capacitance Adjustment Unit]

Figure 5A:
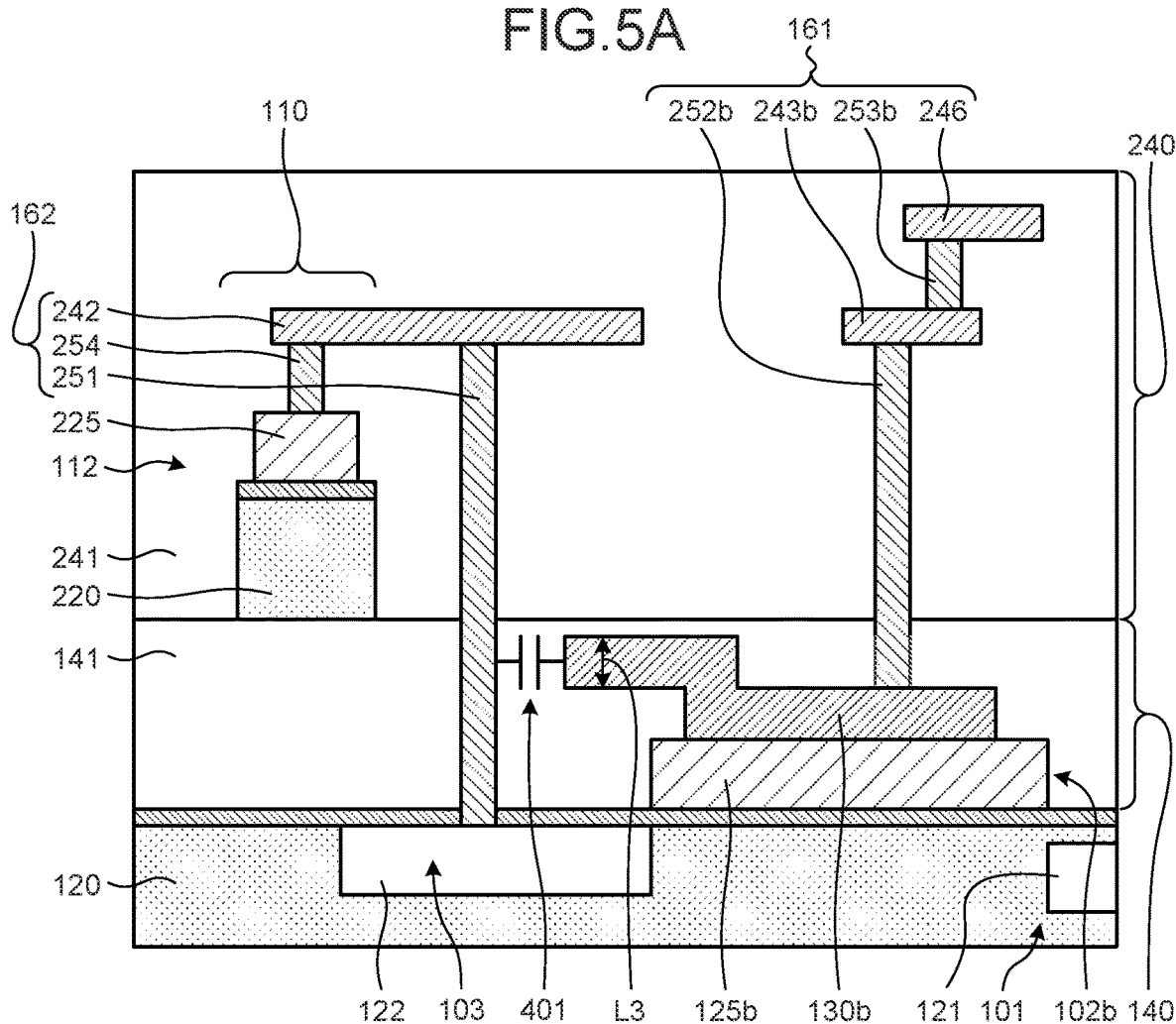
FIG. 5A is a cross-sectional view illustrating a structure example of a capacitance adjustment unit according to the first embodiment of the disclosure.

FIG. 5A is a cross-sectional view illustrating a structure example of a capacitance adjustment unit according to a first embodiment of the disclosure. The drawing is a diagram illustrating a configuration example of the capacitance adjustment unit 130b. The capacitance adjustment unit of the present disclosure will be described by taking the capacitance adjustment unit 130b (for convenience, it is referred to as a capacitance adjustment unit 130) as an example. Note that, in the drawing, the photoelectric conversion unit 101, the charge transfer unit 102b, the charge holding unit 103, and the image signal generating circuit 110 are illustrated in a simplified manner.

As described above, a capacitance adjustment units 130 is disposed in the vicinity of wiring for transmitting a control signal for a charge transfer unit 102 and the wiring connected to the charge holding unit 103 and adjusts electrostatic capacitance between these pieces of wiring. Hereinafter, wiring that transmits a control signal of the charge transfer unit and the wiring connected to the charge holding unit are referred to as a charge transfer unit signal line and a charge holding unit signal line, respectively.

A charge transfer unit signal line 161 in the drawing includes the wiring 246, the via plug 253 (via plug 253b), a wiring 243 (wiring 243b), and the contact plug 252 (contact plug 252b). The charge transfer unit signal line 161 transmits a control signal generated by the vertical drive unit 20 to the charge transfer unit 102 (charge transfer unit 102b). The charge transfer unit signal line 161 in the drawing is connected to the gate electrode of the charge transfer unit 102 via the capacitance adjustment unit 130.

A charge holding unit signal line 162 in the drawing includes the wiring 242, the contact plug 254, and the contact plug 251. The charge holding unit signal line 162 transmits a voltage corresponding to the charge held in the charge holding unit 103 to the image signal generating circuit 110. The charge holding unit signal line 162 in the drawing is connected to the gate electrode 225 of the MOS transistor 112 of the image signal generating circuit 110.

The capacitance adjustment unit 130 in the drawing can be made of a conductor. Specifically, the capacitance adjustment unit 130 in the drawing can be made of polycrystalline silicon doped with an impurity. Furthermore, the capacitance adjustment unit 130 in the drawing can be disposed in connection with a gate electrode 125 (gate electrode 125b) of the charge transfer unit 102 and can have a shape having a region close to the contact plug 251. An electrostatic capacitance 401 between this region and the contact plug 251 is added in parallel to a wiring capacitance between the charge transfer unit signal line 161 and the charge holding unit signal line 162. With this configuration, the wiring capacitance can be adjusted.

Figure 5B:
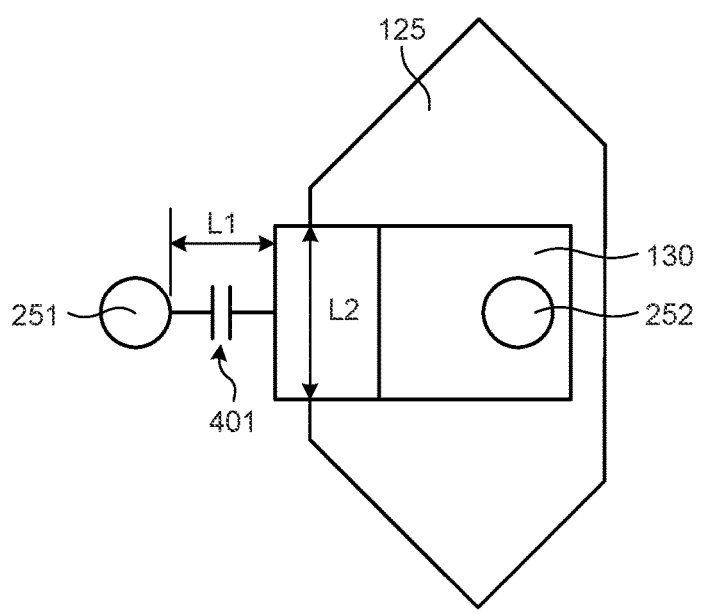
FIG. 5B is a plan view illustrating the structure example of the capacitance adjustment unit according to the first embodiment of the disclosure.

In addition, FIG. 5B is a plan view illustrating the structure example of the capacitance adjustment unit according to the first embodiment of the disclosure. As illustrated in the drawing, the capacitance adjustment unit 130 can be formed in a rectangular shape in top view. L1 in the drawing represents a distance between the capacitance adjustment unit 130 and the contact plug 251. In addition, L2 in the drawing represents the width of the capacitance adjustment unit 130. Moreover, L3 in FIG. 5A represents the thickness of the capacitance adjustment unit 130. The electrostatic capacitance 401 can be adjusted by adjusting L1, L2, and L3. In the capacitance adjustment units 130a, 130b, 130c, and 130d, L1 and others are adjusted, and wiring capacitances between respective charge holding unit signal lines 162 of the charge transfer units 102a, 102b, 102c, and 102d and the charge holding unit signal line 162 are adjusted to equivalent values. As a result, it is possible to reduce variations in the wiring capacitances in the charge transfer units 102a, 102b, 102c, and 102d and to reduce variations in the charge transfer.

Note that the capacitance adjustment unit 130 can be disposed only in a charge transfer unit signal line 161 of a charge transfer unit 102 for which adjustment of the wiring capacitance is required. That is, the capacitance adjustment unit 130 can be arranged in at least one of the charge transfer units 102 arranged in the pixel 100.

Transfer of Charge

Figure 6:
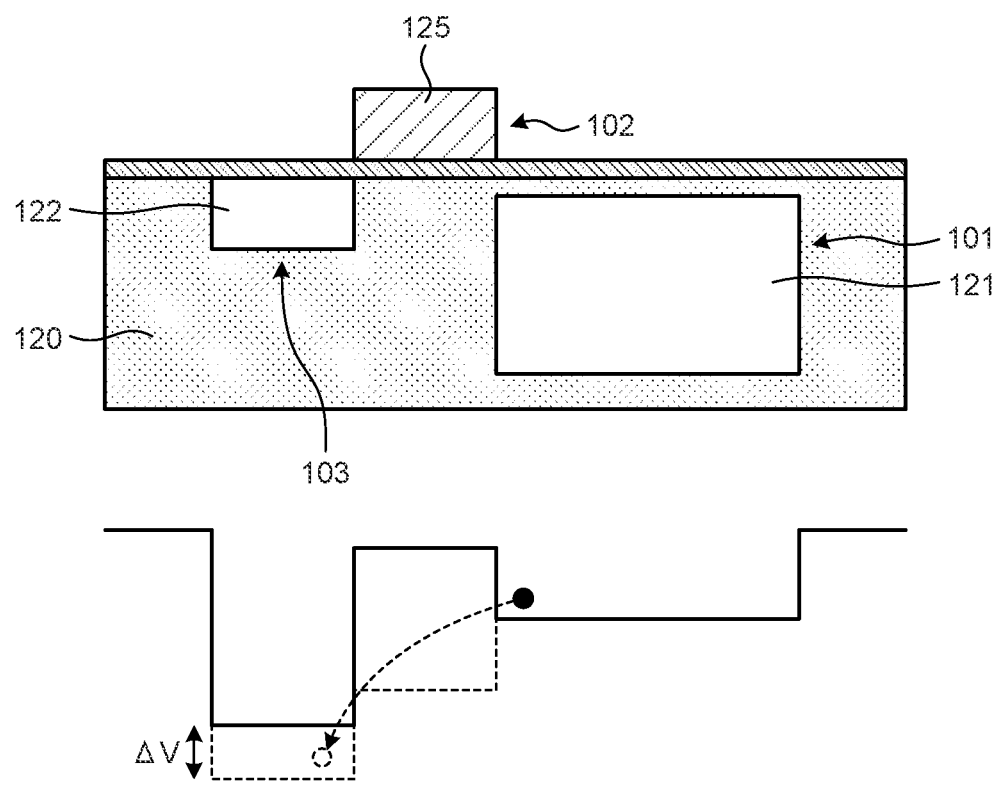
FIG. 6 is a diagram illustrating an example of charge transfer by a charge transfer unit according to an embodiment of the disclosure.

FIG. 6 is a diagram illustrating an example of charge transfer by a charge transfer unit according to an embodiment of the disclosure. The drawing is a diagram illustrating an example of charge transfer in a charge transfer unit 102. The upper diagram in the drawing is a cross-sectional view of the charge transfer unit 102, and the lower diagram illustrates the potential of the charge transfer unit 102. In the lower diagram in the drawing, a black dot represents a charge (electron).

During an exposure period, the charge transfer unit 102 is in a non-conductive state. At this point, since the potential immediately below a gate electrode of the charge transfer unit 102 is shallow, a charge generated in a photoelectric conversion unit 101 is accumulated in a semiconductor region 121. When an ON signal is applied to the charge transfer unit 102 after the lapse of the exposure period, the charge transfer unit 102 transitions to a conduction state. The potential immediately below the gate electrode 125 of the charge transfer unit 102 becomes deeper than the potential of the semiconductor region 121 of the photoelectric conversion unit 101. A dotted line in the lower diagram in the drawing represents the potential in a case where the ON signal is applied. As a result, the charge passes through the charge transfer unit 102 and is transferred to the semiconductor region 122 of the charge holding unit 103. A dotted arrow in the lower diagram in the drawing represents a state of charge transfer.

When the electrostatic capacitance 401 between the charge transfer unit signal line 161 and the charge holding unit signal line 162 changes, the waveform of the ON signal changes. This also results in a change in the charge transfer of the charge transfer unit 102. However, it may seem that a slight change in the electrostatic capacitance 401 does not significantly affect the charge transfer of the charge transfer unit 102.

However, in a case where charge transfer is performed at high speed, such as a case where the imaging element 1 is driven at a high frame frequency, a change in the electrostatic capacitance 401 significantly affects the charge transfer. In a relatively short period of time immediately after the charge transfer unit 102 transitions to the conduction state, the potential of the charge holding unit 103 also becomes deep. ΔV in the lower diagram in the drawing represents this change in the potential. The change in the potential of the charge holding unit 103 promotes the charge transfer. As a result, the time required for transferring the charge can be shortened.

However, when the electrostatic capacitance 401 between the charge transfer unit signal line 161 and the charge holding unit signal line 162 changes and the waveform of the ON signal changes, ΔV fluctuates. For example, in a case where the rise time of the ON signal is longer than a period in which the fluctuation of ΔV appears, ΔV becomes substantially 0. In this case, the above-described effect of promoting the charge transfer disappears. Furthermore, in a case where electrostatic capacitances 401 are different among the plurality of charge transfer units 102, the amount of change in the potential also has a different value for each of the charge transfer units 102. For this reason, variations in charge transfer of the plurality of charge transfer units 102 increase. By arranging the capacitance adjustment units 130 and reducing variations in the electrostatic capacitances 401, changes in the potential can be made uniform, and variations in the charge transfer can be reduced.

Manufacturing Method of Capacitance Adjustment Unit

Figure 7A:
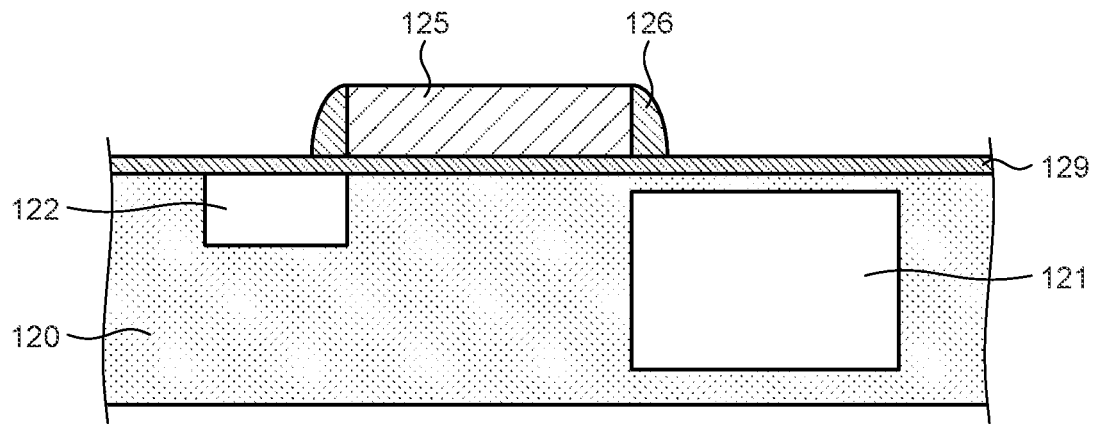
FIG. 7A is a diagram illustrating an example of manufacturing method of the capacitance adjustment unit according to the first embodiment of the disclosure.

FIGS. 7A, 7B, 7C, 7D, 7E, and 7F are diagrams illustrating an example of a manufacturing method of the capacitance adjustment unit according to the first embodiment of the present disclosure. FIGS. 7A, 7B, 7C, 7D, 7E, and 7F are diagrams illustrating an example of manufacturing steps of the capacitance adjustment unit 130. First, a well region is formed in the semiconductor substrate 120, and the semiconductor regions 121 and 122 and others are formed. Next, the insulating film 129 is disposed on the semiconductor substrate 120, and the gate electrode 125 of the charge transfer unit 102 is disposed (FIG. 7A). Note that sidewalls 126 are described on the gate electrode 125 in the drawing.

Figure 7B:
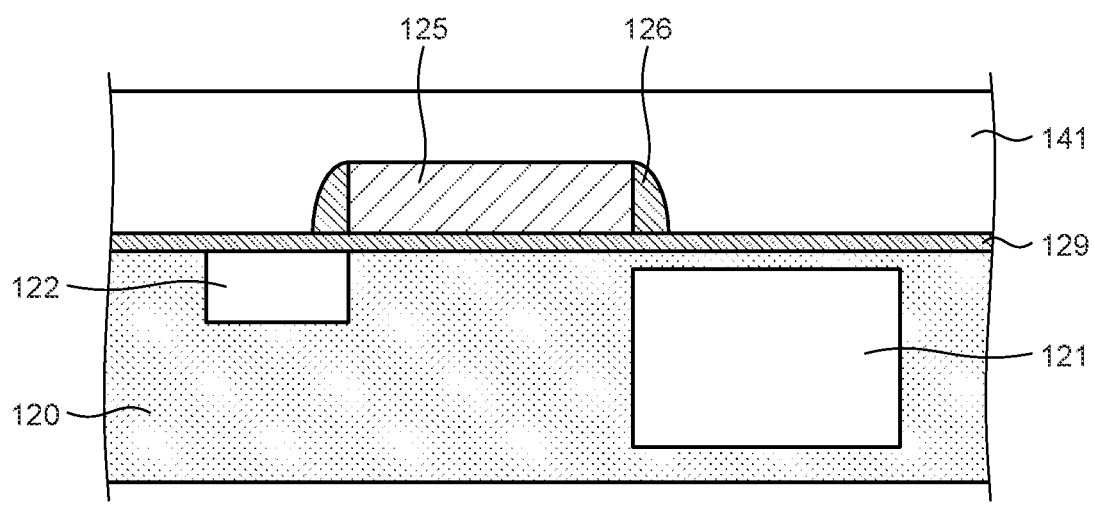
FIG. 7B is a diagram illustrating an example of the manufacturing method of the capacitance adjustment unit according to the first embodiment of the disclosure.

Next, the insulating layer 141 is disposed on the front surface side of the semiconductor substrate 120 (FIG. 7B). This can be performed by forming a SiO$_2$ film by chemical vapor deposition (CVD) or the like. Note that the insulating layer 141 may be ground by CMP to have a desired thickness.

Figure 7C:
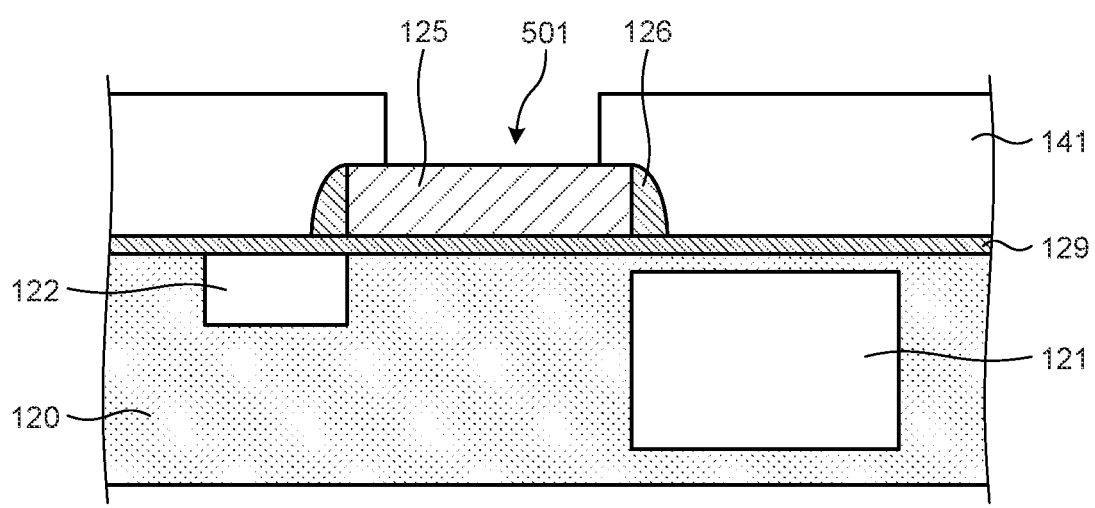
FIG. 7C is a diagram illustrating an example of the manufacturing method of the capacitance adjustment unit according to the first embodiment of the disclosure.

Next, an opening 501 is formed in the insulating layer 141 adjacent to the gate electrode 125 (FIG. 7C). This can be performed by disposing a resist having an opening in a region where the opening 501 is formed on a surface of the insulating layer 141 and etching the insulating layer 141. Dry etching can be applied to this etching.

Figure 7D:
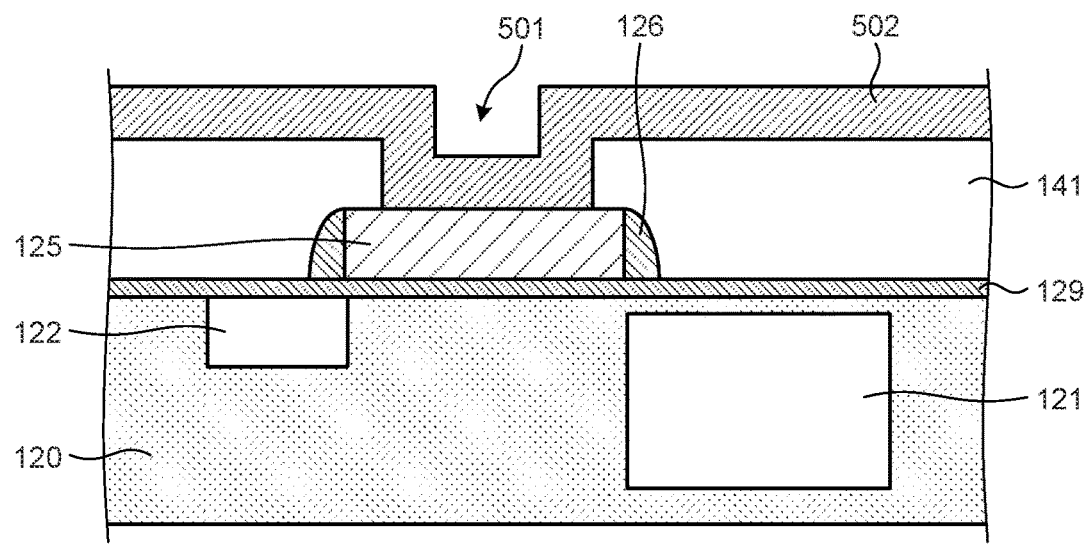
FIG. 7D is a diagram illustrating an example of the manufacturing method of the capacitance adjustment unit according to the first embodiment of the disclosure.
Figure 7E:
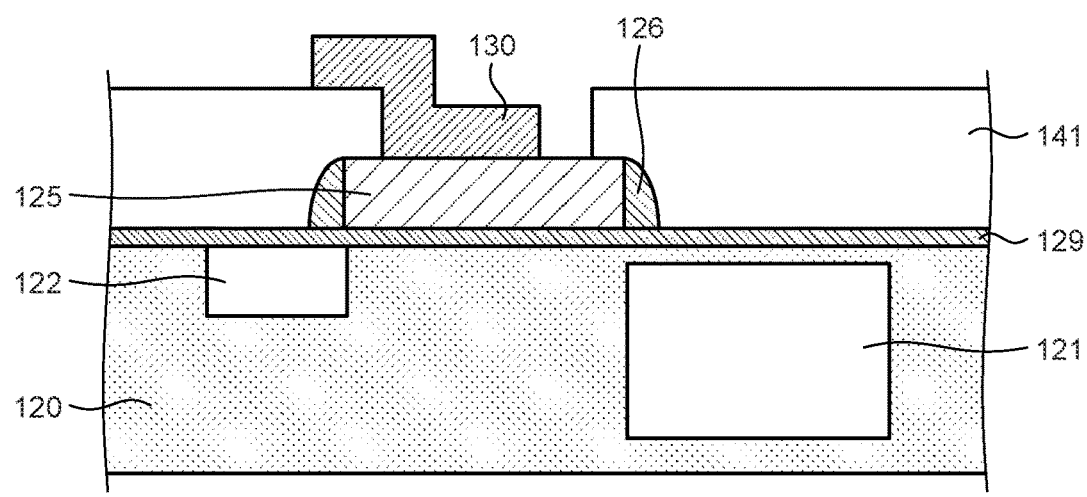
FIG. 7E is a diagram illustrating an example of the manufacturing method of the capacitance adjustment unit according to the first embodiment of the disclosure.

Next, a polycrystalline silicon film 502 is disposed on the surface of the insulating layer 141 including the opening 501 (FIG. 7D). This can be performed by forming a film of polycrystalline silicon by CVD. Next, the polycrystalline silicon film 502 is etched to form the capacitance adjustment unit 130 (FIG. 7E).

Figure 7F:
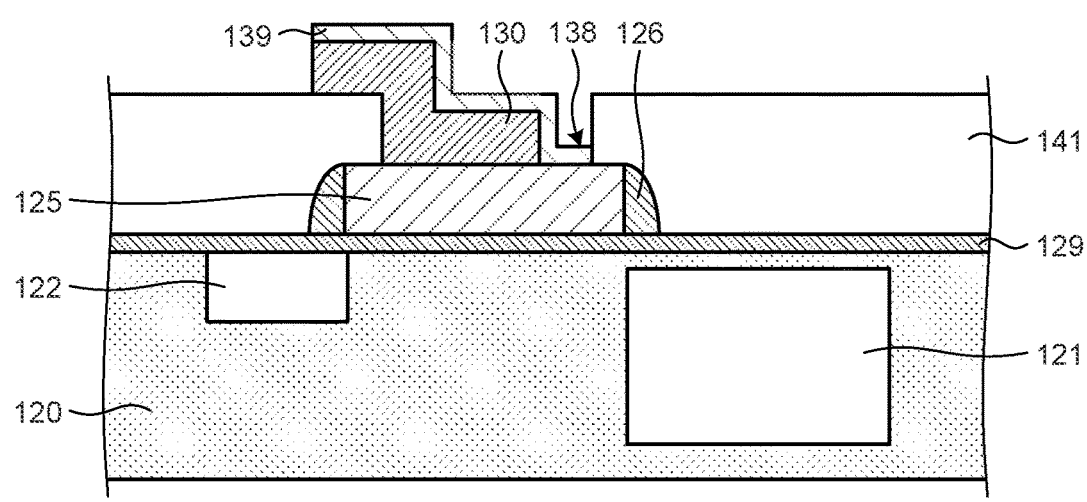
FIG. 7F is a diagram illustrating an example of the manufacturing method of the capacitance adjustment unit according to the first embodiment of the disclosure.

Next, the barrier layer 139 is disposed on the surface of the capacitance adjustment unit 130 (FIG. 7F). This can be performed by forming a material film of the barrier layer 139 by sputtering or CVD and etching. Note that the barrier layer 139 can also be disposed in such a manner as to spread over a surface portion 138 of the gate electrode 125. By disposing the barrier layer 139 on the surface portion 138, the connection resistance between the capacitance adjustment unit 130 and the gate electrode 125 can be reduced.

Structure of Barrier Layer

Figure 8A:
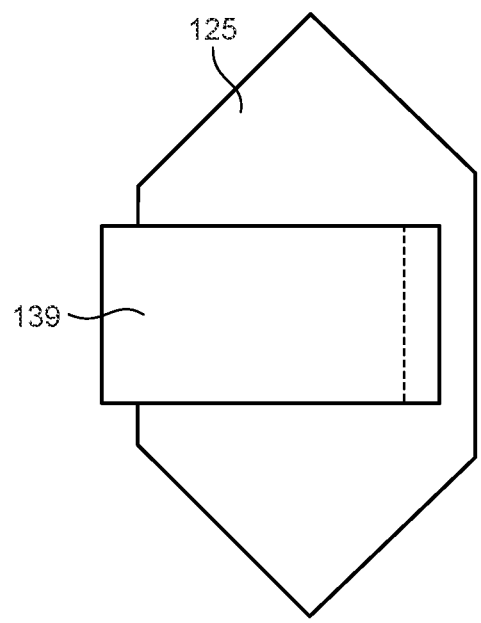
FIG. 8A is a diagram illustrating a structure example of a barrier layer according to the first embodiment of the disclosure.
Figure 8B:
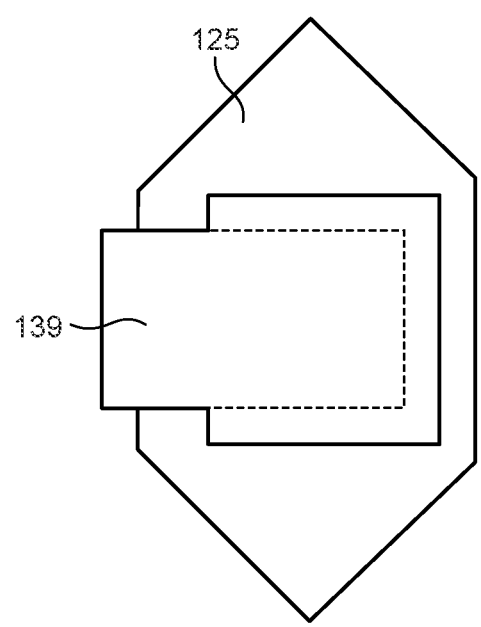
FIG. 8B is a diagram illustrating a structure example of the barrier layer according to the first embodiment of the disclosure.

FIGS. 8A and 8B are diagrams illustrating a structure example of a barrier layer according to the first embodiment of the disclosure. FIGS. 8A and 8B are plan views illustrating a structure example of the barrier layer 139. FIG. 8A is a diagram illustrating an example of a barrier layer 139 having substantially the same shape as that of the capacitance adjustment unit 130.

FIG. 8B is a diagram illustrating an example of a case where the region where the barrier layer 139 is disposed on the surface of the gate electrode 125 is widened. The connection resistance between the capacitance adjustment unit 130 and the gate electrode 125 can be reduced as compared with the example of FIG. 8A.

First Modification

Figure 9A:
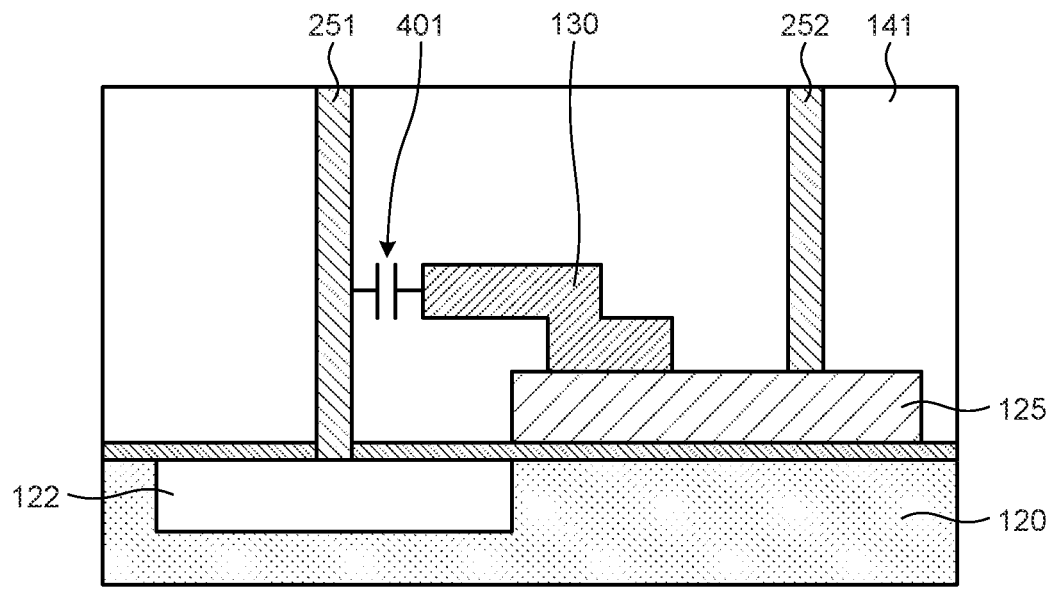
FIG. 9A is a cross-sectional view illustrating a first modification of the capacitance adjustment unit according to the first embodiment of the disclosure.
Figure 9B:
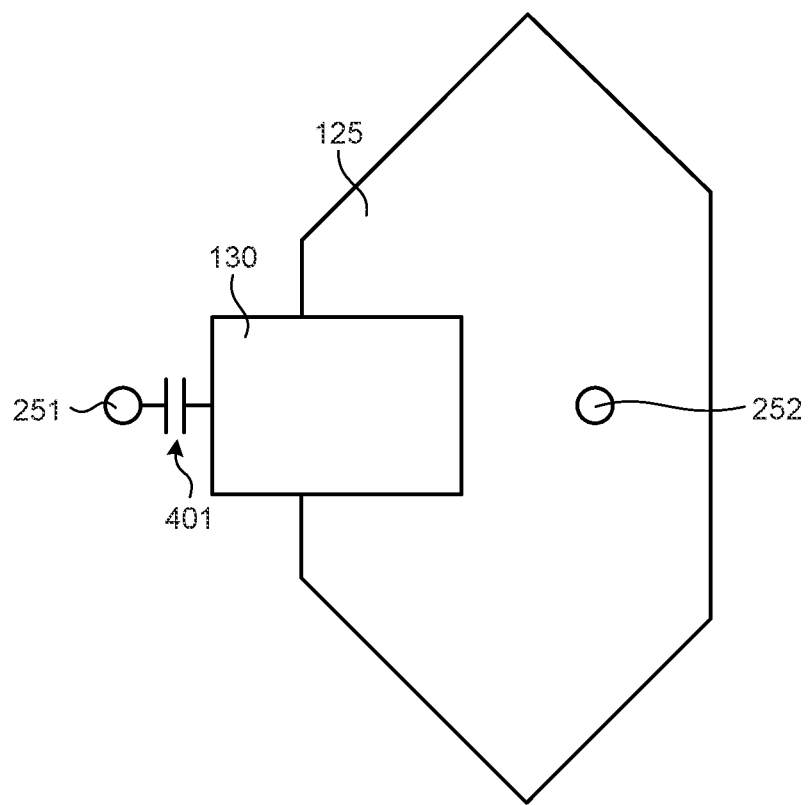
FIG. 9B is a plan view illustrating the first modification of the capacitance adjustment unit according to the first embodiment of the disclosure.

FIG. 9A is a cross-sectional view illustrating a first modification of the capacitance adjustment unit according to the first embodiment of the present disclosure. FIG. 9B is a plan view illustrating the first modification of the capacitance adjustment unit according to the first embodiment of the disclosure. A capacitance adjustment unit 130 in FIGS. 9A and 9B illustrate an example in which a region in contact with a gate electrode 125 is reduced as compared with the capacitance adjustment unit 130 in FIGS. 5A and 5B. A contact plug 252 is directly connected to the gate electrode 125.

Second Modification

Figure 10A:
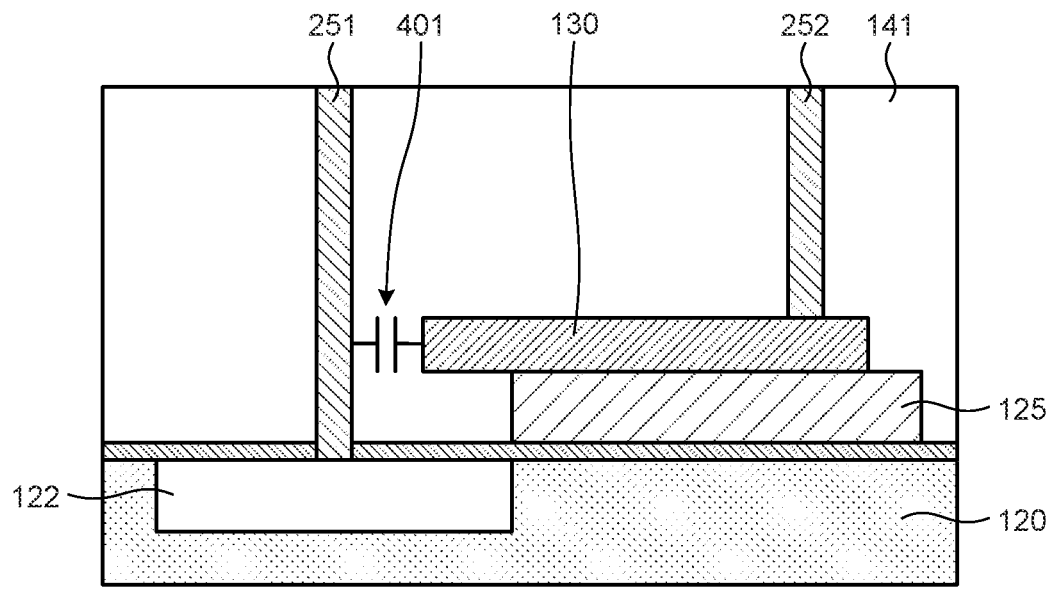
FIG. 10A is a cross-sectional view illustrating a second modification of the capacitance adjustment unit according to the first embodiment of the disclosure.
Figure 10B:
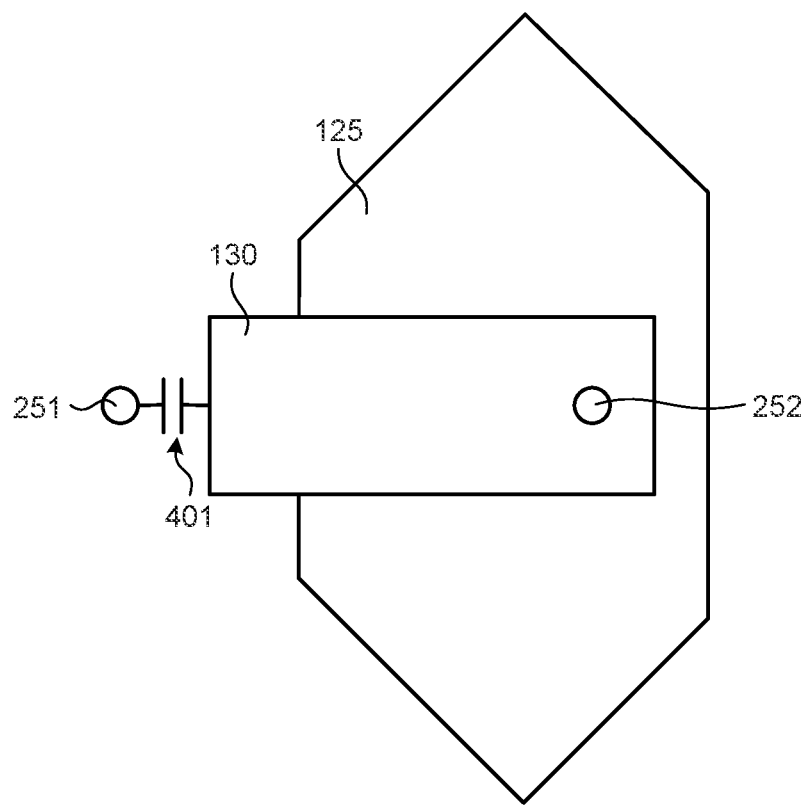
FIG. 10B is a plan view illustrating the second modification of the capacitance adjustment unit according to the first embodiment of the disclosure.

FIG. 10A is a cross-sectional view illustrating a second modification of the capacitance adjustment unit according to the first embodiment of the present disclosure. FIG. 10B is a plan view illustrating the second modification of the capacitance adjustment unit according to the first embodiment of the disclosure. A capacitance adjustment unit 130 in FIGS. 10A and 10B illustrate an example in which a step of the capacitance adjustment unit 130 in FIGS. 5A and 5B are reduced. Since the capacitance adjustment unit 130 is disposed close to a semiconductor region 122 of a charge holding unit 103, an electrostatic capacitance 401 can be increased as compared with the capacitance adjustment unit 130 in FIGS. 5A and 5B. The adjustment range of the electrostatic capacitance 401 by the capacitance adjustment unit 130 can be expanded.

Third Modification

Figure 11A:
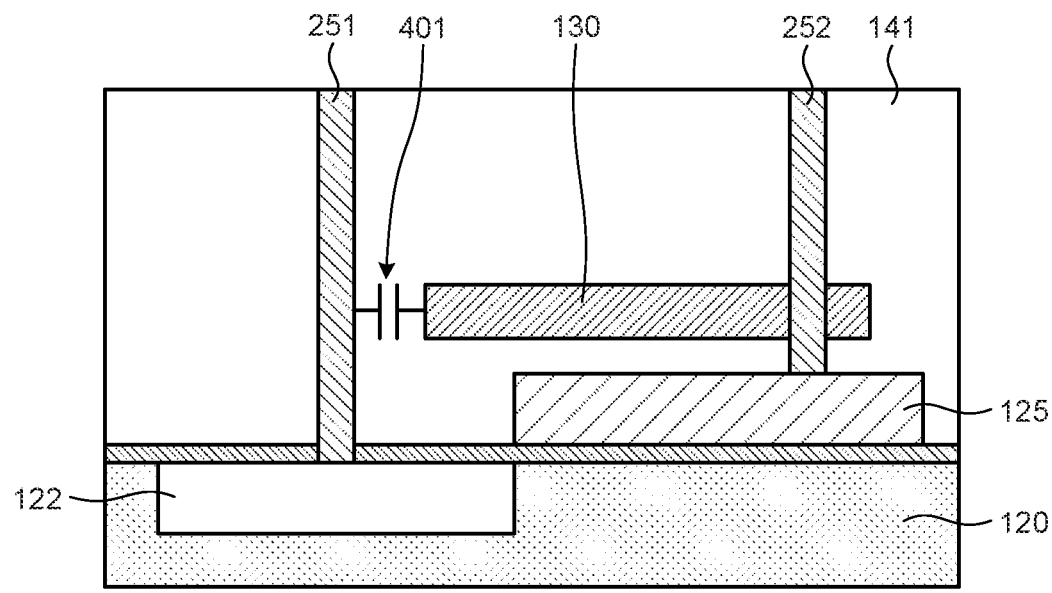
FIG. 11A is a cross-sectional view illustrating a third modification of the capacitance adjustment unit according to the first embodiment of the disclosure.
Figure 11B:
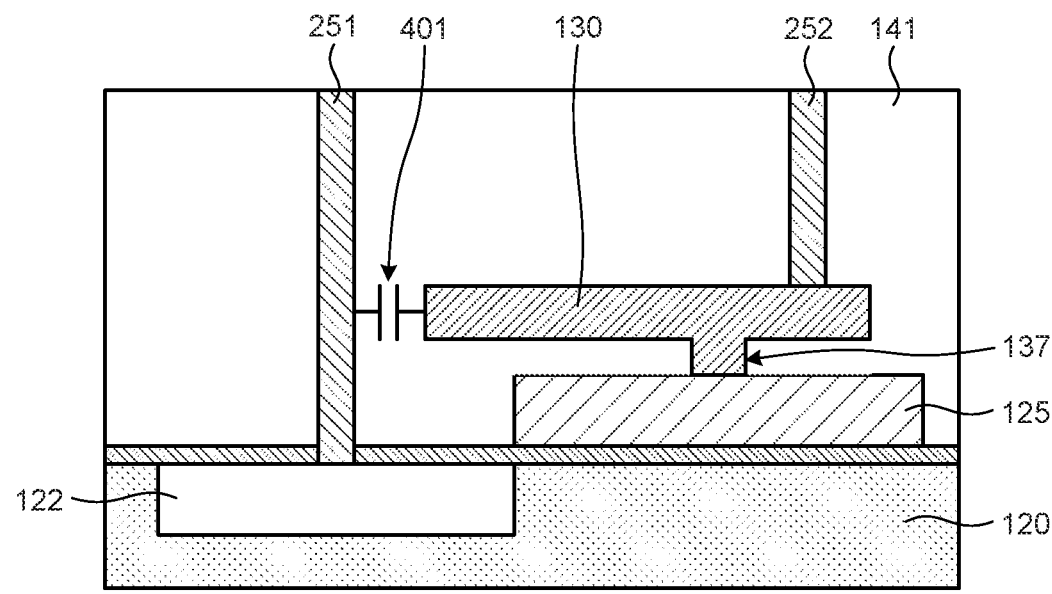
FIG. 11B is a cross-sectional view illustrating the third modification of the capacitance adjustment unit according to the first embodiment of the disclosure.

FIGS. 11A and 11B are cross-sectional views illustrating a third modification of the capacitance adjustment unit according to the first embodiment of the present disclosure. A capacitance adjustment unit 130 in FIGS. 11A and 11B illustrate an example of the capacitance adjustment unit 130 arranged at a position separated from a gate electrode 125. FIG. 11A is a diagram illustrating an example in which a contact plug 252 is formed in a shape that penetrates the capacitance adjustment unit 130 and is connected to the gate electrode 125. Moreover, FIG. 11B is a diagram illustrating an example in which the capacitance adjustment unit 130 and the gate electrode 125 are connected by a columnar connection portion 137 formed at the bottom of the capacitance adjustment unit 130. The contact plug 252 is connected to the capacitance adjustment unit 130. In these examples, the capacitance adjustment unit 130 is disposed at a position separated from a semiconductor region 122 included in a charge holding unit 103, and the influence of a distance between the capacitance adjustment unit 130 and the semiconductor region 122 on the electrostatic capacitance 401 can be reduced. Note that the planar structure of the plane of the capacitance adjustment unit 130 in FIGS. 11A and 11B can adopt the same structure as that in FIG. 10B.

Fourth Modification

Figure 12:
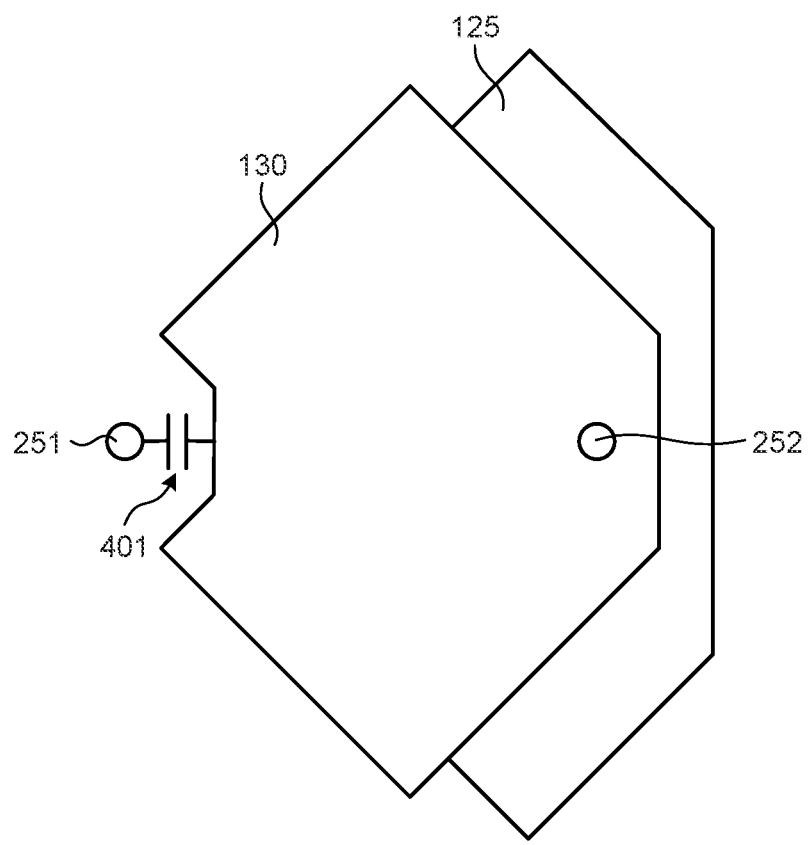
FIG. 12 is a plan view illustrating a fourth modification of the capacitance adjustment unit according to the first embodiment of the disclosure.

FIG. 12 is a plan view illustrating a fourth modification of the capacitance adjustment unit according to the first embodiment of the disclosure. The drawing a diagram illustrating a planar structure of the capacitance adjustment unit 130 similarly to FIG. 10B. This differs from the capacitance adjustment unit 130 in FIG. 10B in that a face facing the contact plug 251 is expanded. The capacitance adjustment unit 130 in the drawing can improve the electrostatic capacitance 401. Note that the cross-sectional structure of the capacitance adjustment unit 130 can adopt a structure similar to that of the capacitance adjustment unit 130 in FIG. 11B.

Note that the configuration of the imaging element 1 according to the first embodiment of the disclosure is not limited to this example. For example, two sets of a photoelectric conversion unit 101 and a charge transfer unit 102 may be arranged in a pixel 100.

As described above, in the imaging element 1 according to the first embodiment of the present disclosure, the capacitance adjustment unit 130 is disposed to adjust the electrostatic capacitance 401 between the charge holding unit signal lines 162 connected to the respective charge transfer units 102 of the pixel 100 and the charge holding unit signal line 162 connected to the charge holding unit 103. As a result, it is possible to reduce variations in the electrostatic capacitances 401 between the plurality of charge transfer unit signal lines 161 and the charge holding unit signal line 162. It is possible to reduce variations in charge transfer in the plurality of charge transfer units arranged in the pixel 100.

2. Second Embodiment

In the imaging element 1 of the first embodiment described above, the capacitance adjustment unit 130 is disposed in the charge transfer unit signal line 161 of the pixel 100. On the other hand, an imaging element 1 according to a second embodiment of the present disclosure is different from the first embodiment in that a capacitance adjustment unit connected to a charge holding unit signal line 162 is further disposed.

Structure of Capacitance Adjustment Unit

Figure 13A:
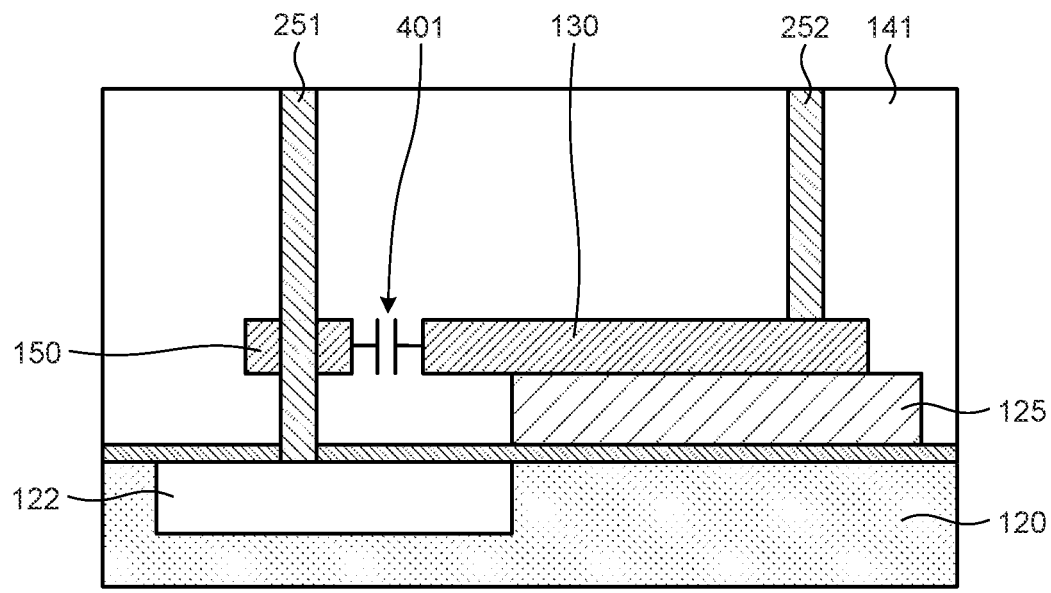
FIG. 13A is a cross-sectional view illustrating a structure example of a capacitance adjustment unit according to a second embodiment of the disclosure.
Figure 13B:
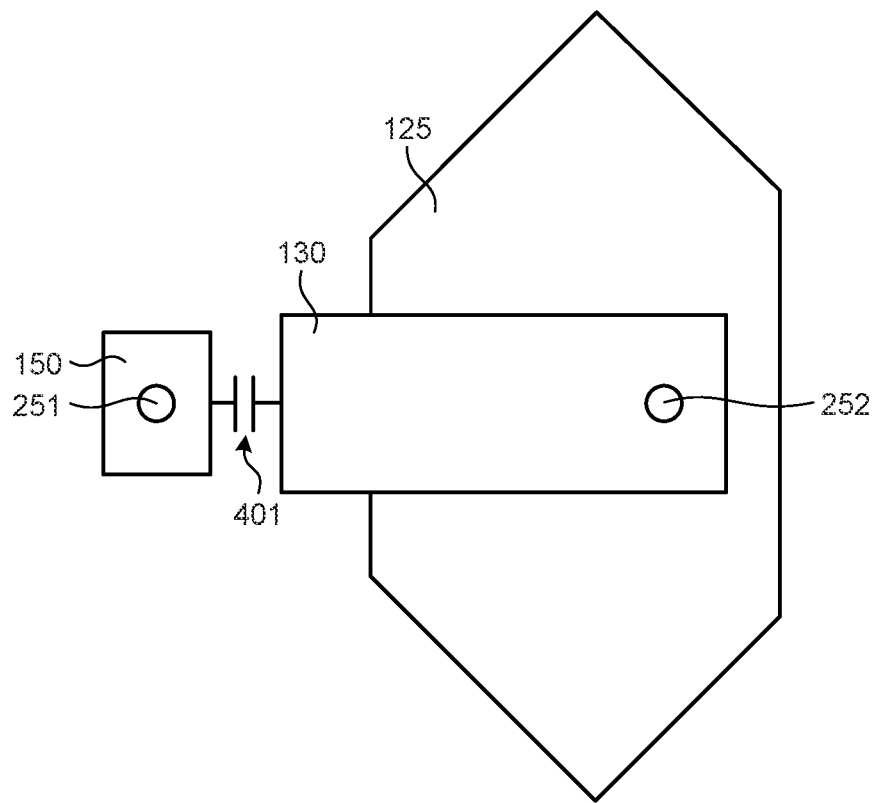
FIG. 13B is a plan view illustrating the structure example of the capacitance adjustment unit according to the second embodiment of the disclosure.

FIG. 13A is a cross-sectional view illustrating a structure example of a capacitance adjustment unit according to the second embodiment of the disclosure. FIG. 13B is a plan view illustrating the structure example of the capacitance adjustment unit according to the second embodiment of the disclosure. A pixel 100 in FIGS. 13A and 13B are different from the pixel 100 in FIGS. 5A and 5B in further including a capacitance adjustment unit 150.

The capacitance adjustment unit 150 is connected to a charge holding unit signal line 162 and adjusts the electrostatic capacitance with respect to a charge transfer unit signal line 161. A contact plug 251 in the drawing is formed in a shape penetrating the capacitance adjustment unit 150, and the capacitance adjustment unit 150 is connected to the contact plug 251. The capacitance adjustment unit 150 has an effect of increasing the area of a portion in the contact plug 251 facing a capacitance adjustment unit 130. The capacitance adjustment unit 150 can be made of a member similar to that of the capacitance adjustment unit 130.

First Modification

Figure 14:
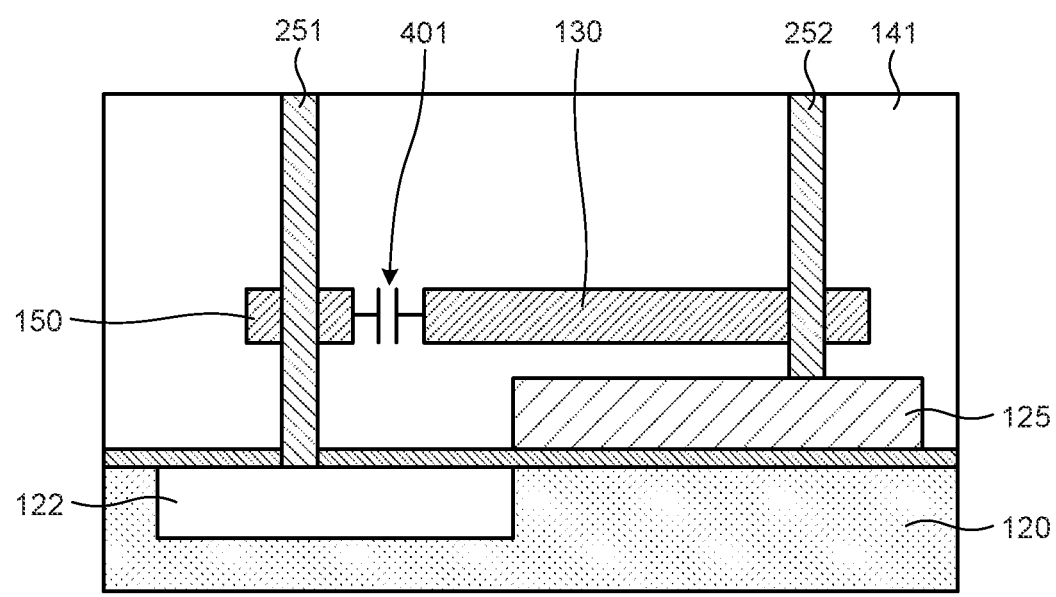
FIG. 14 is a cross-sectional view illustrating a first modification of the capacitance adjustment unit according to the second embodiment of the disclosure.

FIG. 14 is a cross-sectional view illustrating a first modification of the capacitance adjustment unit according to the second embodiment of the disclosure. The drawing illustrates an example in which a capacitance adjustment unit 130 is disposed separated from a gate electrode 125, similarly to the capacitance adjustment unit 130 in FIG. 10A. A capacitance adjustment unit 150 is disposed at the same level as the capacitance adjustment unit 130.

Second Modification

Figure 15A:
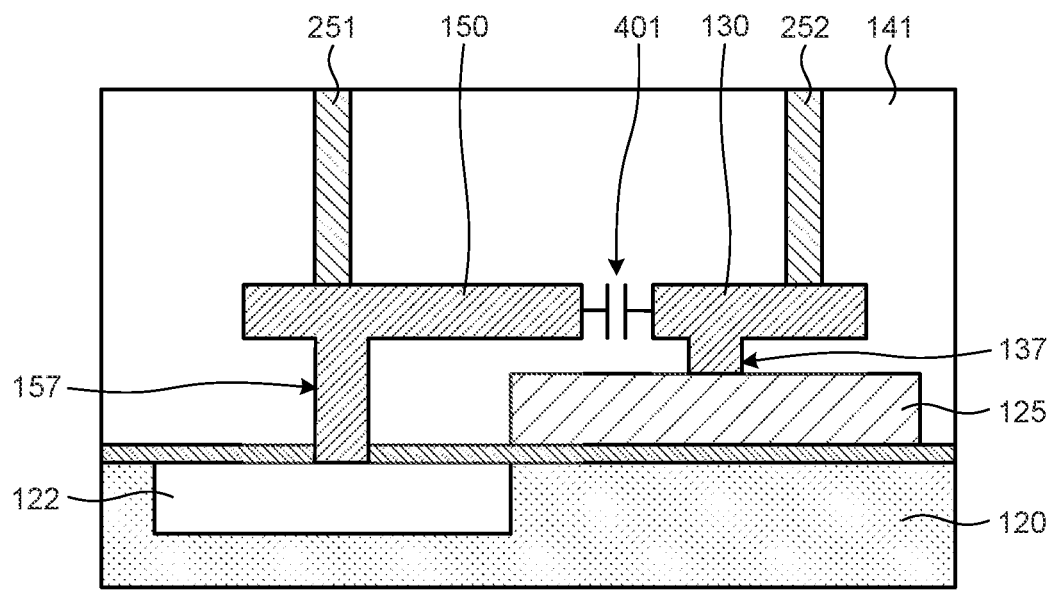
FIG. 15A is a cross-sectional view illustrating a second modification of the capacitance adjustment unit according to the second embodiment of the disclosure.

FIG. 15A is a cross-sectional view illustrating a second modification of the capacitance adjustment unit according to the second embodiment of the present disclosure. A capacitance adjustment unit 150 in the drawing includes a connection portion 137 similarly to the capacitance adjustment unit 150 in FIG. 11B. In addition, the capacitance adjustment unit 150 in the drawing includes a connection portion 157 connected to a semiconductor region 122 of a charge holding unit 103 and is at the same level as that of a capacitance adjustment unit 130.

Figure 15B:
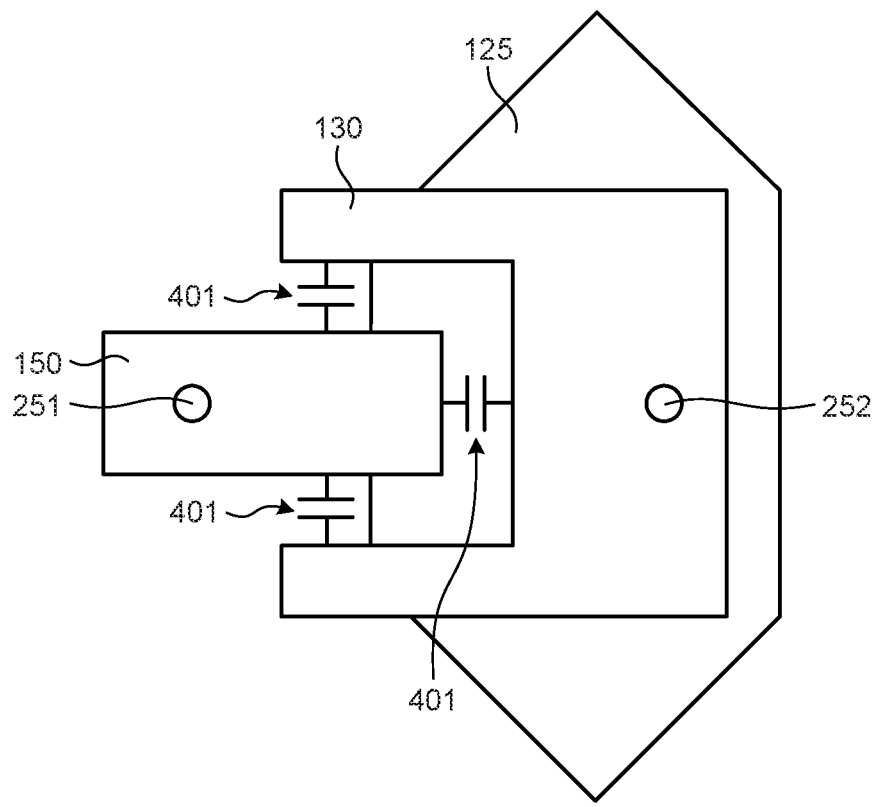
FIG. 15B is a plan view illustrating the second modification of the capacitance adjustment unit according to the second embodiment of the disclosure.

FIG. 15B is a plan view illustrating the second modification of the capacitance adjustment unit according to the second embodiment of the disclosure. The capacitance adjustment unit 130 in the drawing illustrates an example in which a region facing the charge holding unit signal line 162 is formed in a U-shape surrounding the capacitance adjustment unit 150. In the capacitance adjustment unit 130 in the drawing, a region facing the capacitance adjustment unit 150 can be widened, and the electrostatic capacitances 401 can be increased.

The configuration of the imaging element 1 other than the above is similar to the configuration of the imaging element 1 in the first embodiment of the present disclosure, and thus description thereof is omitted.

As described above, in the imaging element 1 according to the second embodiment of the present disclosure, the capacitance adjustment unit 130 and the capacitance adjustment unit 150 are arranged in the charge transfer unit signal line 161 and the charge holding unit signal line 162 of the pixel 100, respectively, and the electrostatic capacitances 401 are adjusted.

3. Third Embodiment

In the imaging element 1 of the first embodiment described above, the capacitance adjustment unit 130 is disposed in the charge transfer unit signal line 161 of the pixel 100. On the other hand, an imaging element 1 according to a third embodiment of the present disclosure is different from the first embodiment in that a capacitance adjustment unit is disposed in a charge holding unit signal line 162.

Structure of Capacitance Adjustment Unit

Figure 16A:
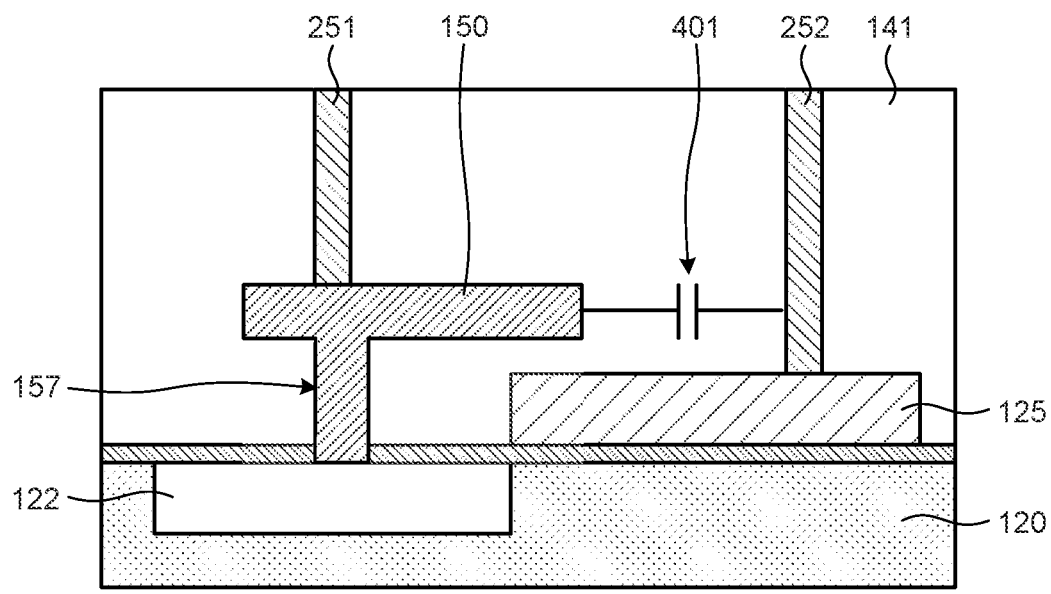
FIG. 16A is a cross-sectional view illustrating a structure example of a capacitance adjustment unit according to a third embodiment of the disclosure.
Figure 16B:
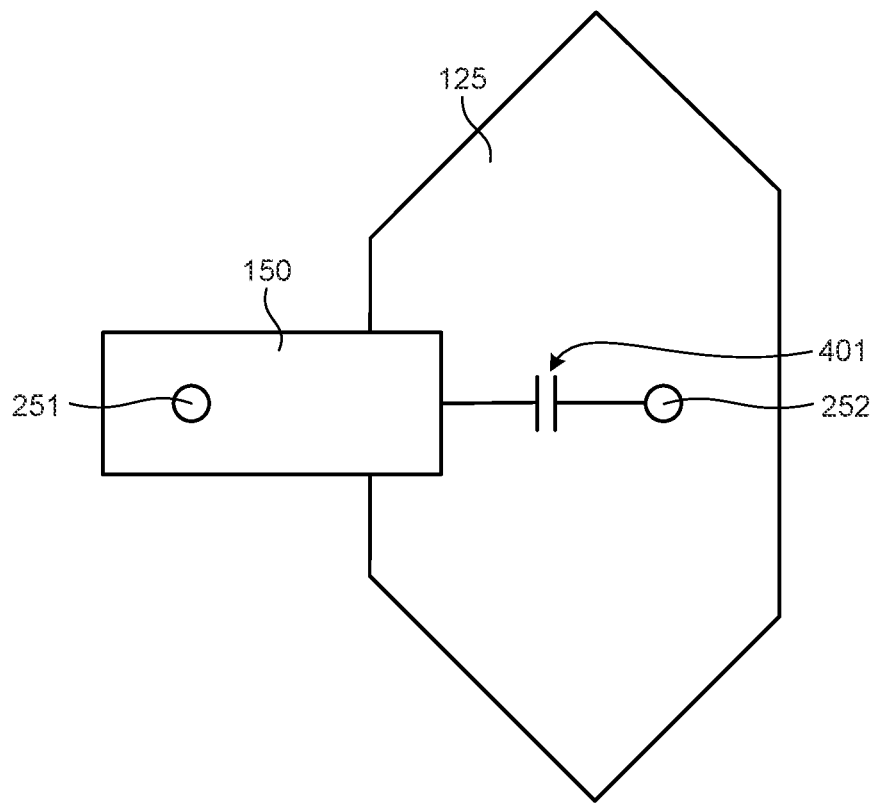
FIG. 16B is a plan view illustrating a structure example of the capacitance adjustment unit according to the third embodiment of the disclosure.

FIG. 16A is a cross-sectional view illustrating a structure example of a capacitance adjustment unit according to the third embodiment of the disclosure. FIG. 16B is a plan view illustrating the structure example of the capacitance adjustment unit according to the third embodiment of the disclosure. A pixel 100 in FIGS. 16A and 16B are different from the pixel 100 in FIGS. 5A and 5B in including a capacitance adjustment unit 150 instead of the capacitance adjustment unit 130.

The capacitance adjustment unit 150 in the drawing includes a connection portion 157 similarly to the capacitance adjustment unit 150 in FIG. 15A. In addition, the capacitance adjustment unit 150 in the drawing has an end portion extended to a position overlapping a gate electrode 125.

First Modification

Figure 17A:
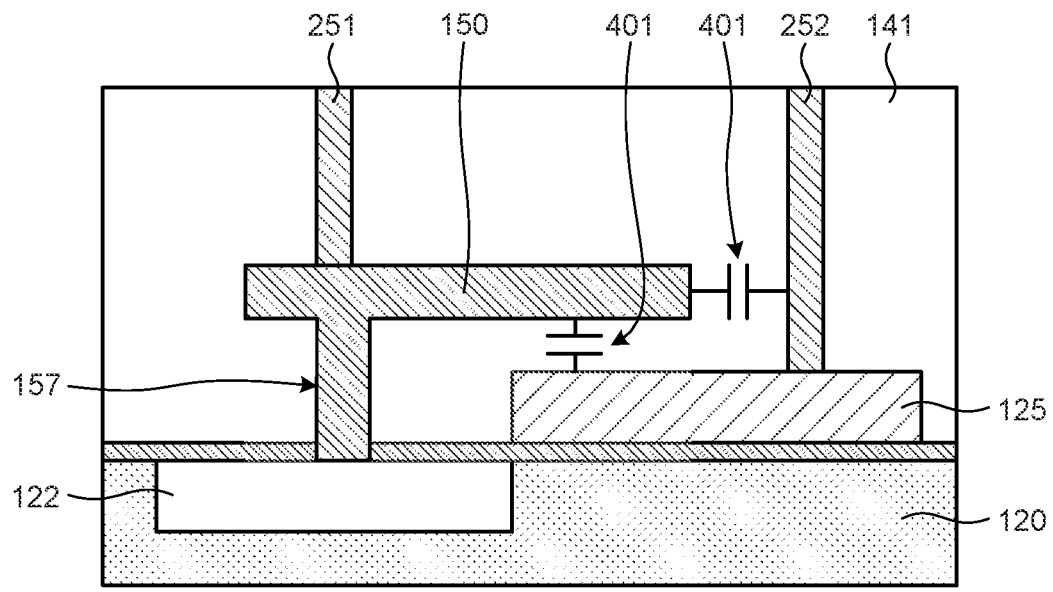
FIG. 17A is a cross-sectional view illustrating a first modification of the capacitance adjustment unit according to the third embodiment of the disclosure.
Figure 17B:
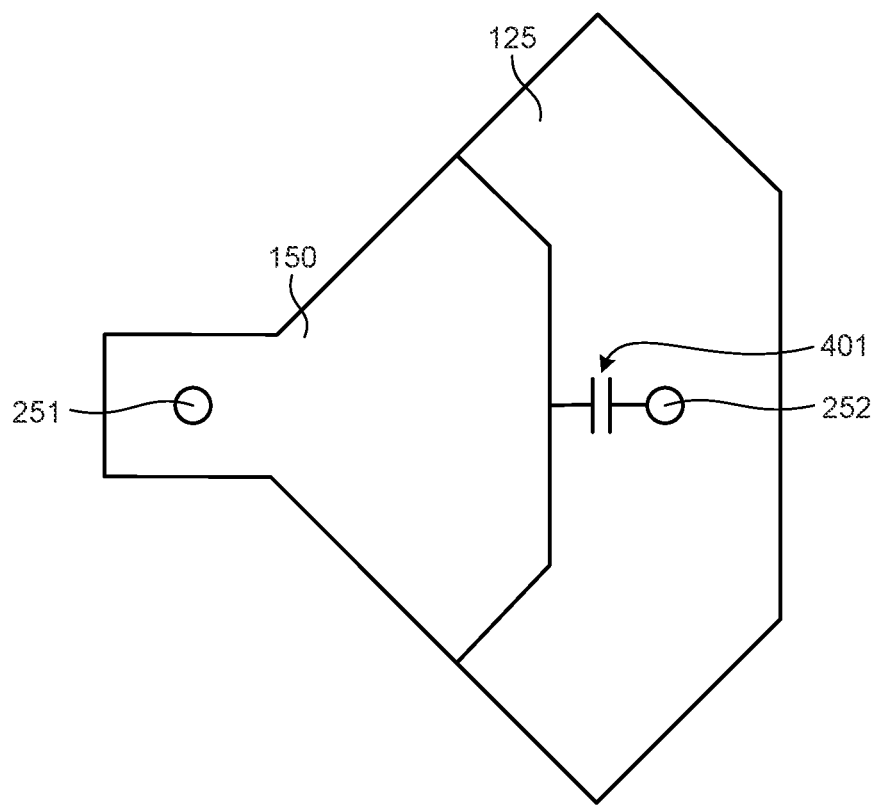
FIG. 17B is a plan view illustrating the first modification of the capacitance adjustment unit according to the third embodiment of the disclosure.

FIG. 17A is a cross-sectional view illustrating a first modification of the capacitance adjustment unit according to the third embodiment of the disclosure. FIG. 17B is a plan view illustrating the first modification of the capacitance adjustment unit according to the third embodiment of the disclosure. As illustrated in FIG. 17B, it is a diagram illustrating an example in which a capacitance adjustment unit 150 in the drawing has a shape in which a region facing a contact plug 252 is expanded.

Second Modification

Figure 18:
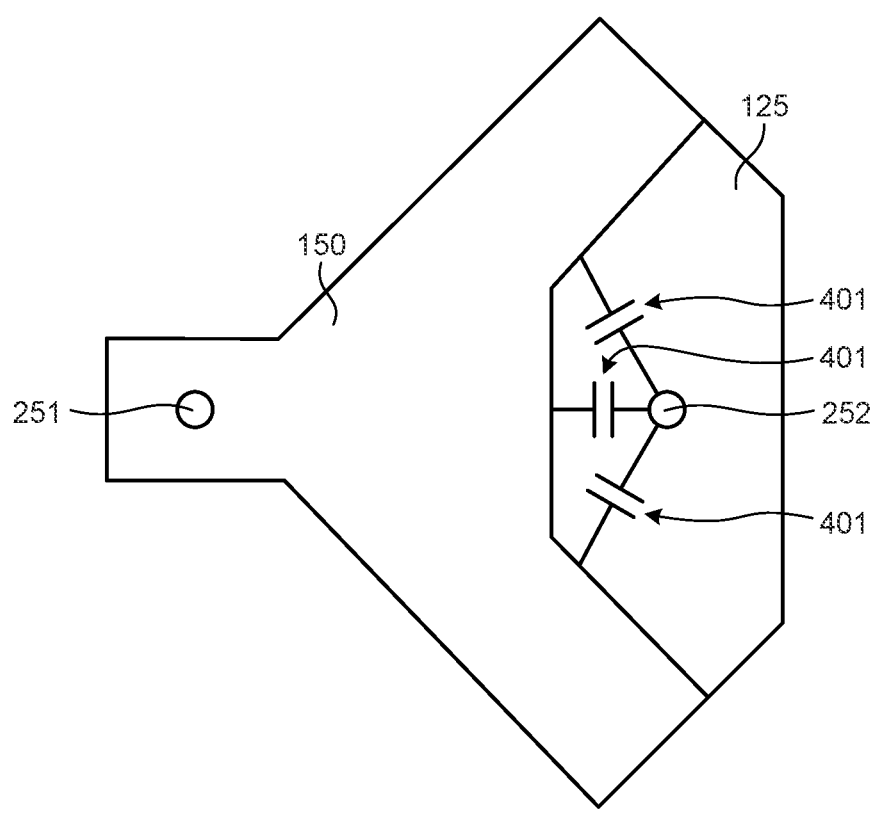
FIG. 18 is a plan view illustrating a second modification of the capacitance adjustment unit according to the third embodiment of the disclosure.

FIG. 18 is a plan view illustrating a second modification of the capacitance adjustment unit according to the third embodiment of the disclosure. The capacitance adjustment unit 150 in the drawing illustrates an example in which a region facing a contact plug 252 is further expanded as compared with that in the capacitance adjustment unit 150 in FIG. 17B.

The configuration of the imaging element 1 other than the above is similar to the configuration of the imaging element 1 in the first embodiment of the present disclosure, and thus description thereof is omitted.

As described above, in the imaging element 1 according to the third embodiment of the present disclosure, the capacitance adjustment unit 150 is disposed in a charge holding unit signal line 162 of the pixel 100 to adjust an electrostatic capacitance 401.

4. Fourth Embodiment

In the imaging element 1 of the first embodiment described above, the capacitance adjustment unit 130 is disposed in the charge transfer unit signal line 161 of the pixel 100. On the other hand, an imaging element 1 according to a fourth embodiment of the present disclosure is different from the above-described first embodiment in that a capacitance adjustment unit is disposed between a charge transfer unit signal line 161 and a charge holding unit signal line 162.

Structure of Capacitance Adjustment Unit

Figure 19A:
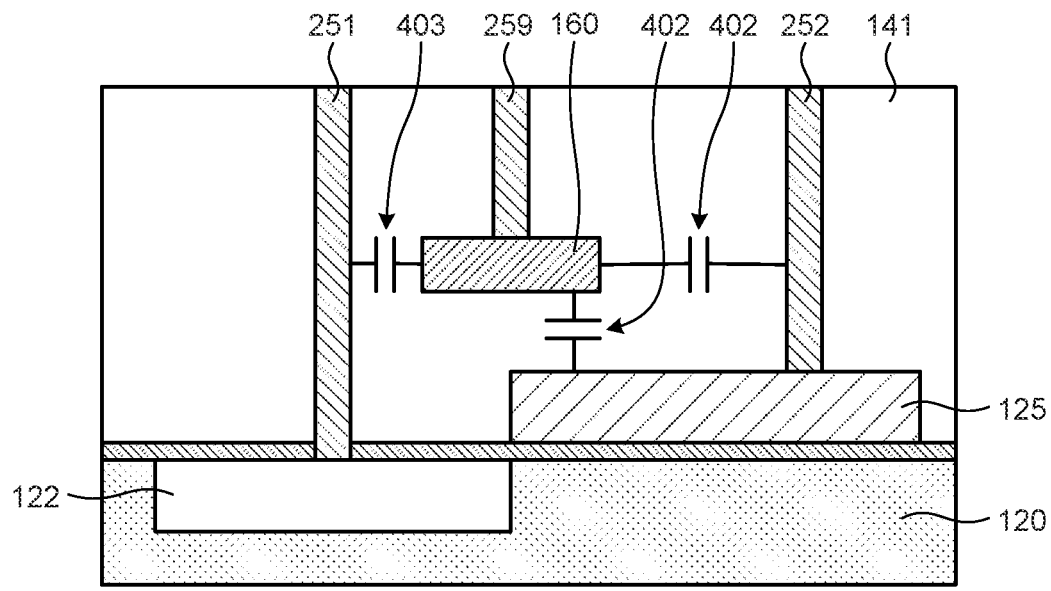
FIG. 19A is a cross-sectional view illustrating a structure example of a capacitance adjustment unit according to a fourth embodiment of the disclosure.
Figure 19B:
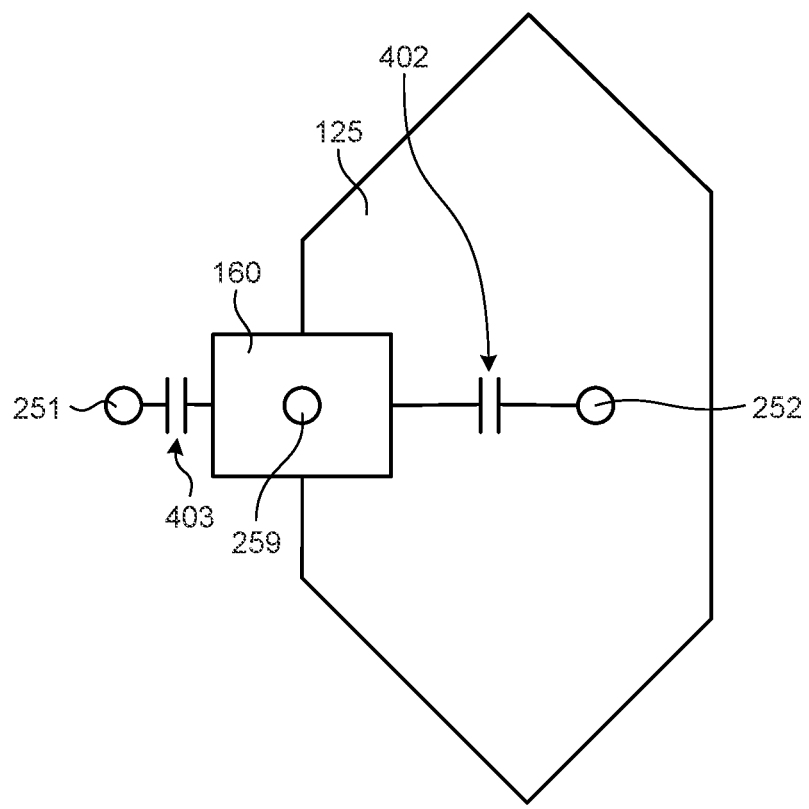
FIG. 19B is a plan view illustrating a structure example of the capacitance adjustment unit according to the fourth embodiment of the disclosure.

FIG. 19A is a cross-sectional view illustrating a structure example of a capacitance adjustment unit according to the fourth embodiment of the disclosure. FIG. 19B is a plan view illustrating the structure example of the capacitance adjustment unit according to the fourth embodiment of the disclosure. The pixel 100 in FIGS. 19A and 19B are different from the pixel 100 in FIGS. 5A and 5B in including a capacitance adjustment unit 160 instead of the capacitance adjustment unit 130.

The capacitance adjustment unit 160 is disposed between a charge transfer unit signal line 161 and a charge holding unit signal line 162 and adjusts an electrostatic capacitance 401 between the charge transfer unit signal line 161 and the charge holding unit signal line 162. As illustrated in FIGS. 19A and 19B, since the capacitance adjustment unit 160 is not connected to either the charge transfer unit signal line 161 or the charge holding unit signal line 162, a capacitance component is formed between the charge transfer unit signal line 161 and the charge holding unit signal line 162. Let an electrostatic capacitance between the capacitance adjustment unit 160 and a contact plug 252 and an electrostatic capacitance between the capacitance adjustment unit 160 and a contact plug 251 be electrostatic capacitances 402 and 403, respectively, and the electrostatic capacitance 401 between the contact plugs 251 and 252 can be expressed by the following equation.

$$C401 = C402 \times C403 / (C402 + C403)$$

Incidentally, C401 represents the value of the electrostatic capacitance 401. C402 represents the value of the electrostatic capacitance 402. C403 represents the value of the electrostatic capacitance 403. As the above, the electrostatic capacitance 401 has an electrostatic capacitance value in a case where the electrostatic capacitances 402 and 403 are connected in series.

The capacitance adjustment unit 160 can be made of a conductor, for example, polycrystalline silicon doped with an impurity. In this case, an effect is achieved that the distance between the contact plugs 251 and 252 is shortened by the length of the capacitance adjustment unit 160 in the vicinity of the capacitance adjustment unit 160. That is, by disposing the capacitance adjustment unit 160, the electrostatic capacitance 401 between the contact plugs 251 and 252 increases. By adjusting the size of the capacitance adjustment unit 160, the electrostatic capacitance 401 between the contact plugs 251 and 252 can be adjusted.

Note that a contact plug 259 is disposed in the capacitance adjustment unit 160 in the drawing, and a signal different from signals transmitted by the contact plugs 251 and 252 can be applied to the capacitance adjustment unit 160. Alternatively, the contact plug 259 can be omitted to make the capacitance adjustment unit 160 to be in a floating state.

Further alternatively, the capacitance adjustment unit 160 may be made of an insulating material (dielectric). At this point, by making the capacitance adjustment unit 160 to have a dielectric constant different from that of an insulating layer 141, the electrostatic capacitance 401 between the contact plugs 251 and 252 can be adjusted. This is because the electrostatic capacitance 401 is configured by connecting capacitors including dielectrics having different dielectric constants in series. The capacitance adjustment unit 160 can be made of, for example, polycrystalline silicon. This is because polycrystalline silicon that is not doped with an impurity behaves as a dielectric. In addition, characteristics of polycrystalline silicon can change from those of an insulating material to those of a conductor by adjusting the doping amount of an impurity. That is, it is possible to obtain a dielectric constant corresponding to the doping amount of the impurity. Therefore, the electrostatic capacitance 401 can be adjusted by disposing the capacitance adjustment unit 160 made of polycrystalline silicon and adjusting the doping amount of the impurity.

The configuration of the imaging element 1 other than the above is similar to the configuration of the imaging element 1 in the first embodiment of the present disclosure, and thus description thereof is omitted.

As described above, in the imaging element 1 according to the fourth embodiment of the present disclosure, the electrostatic capacitance 401 can be adjusted by the capacitance adjustment unit 160 disposed between the charge transfer unit signal line 161 and the charge holding unit signal line 162 of the pixel 100.

5. Fifth Embodiment

In the imaging element 1 of the first embodiment described above, one charge holding unit 103 is shared by four pairs of a photoelectric conversion unit 101 and a charge transfer unit 102. On the other hand, an imaging element 1 according to a fifth embodiment of the present disclosure is different from the first embodiment in that a charge holding unit 103 is disposed for each pair of a photoelectric conversion unit 101 and a charge transfer unit 102.

Configuration of Pixel

Figure 20:
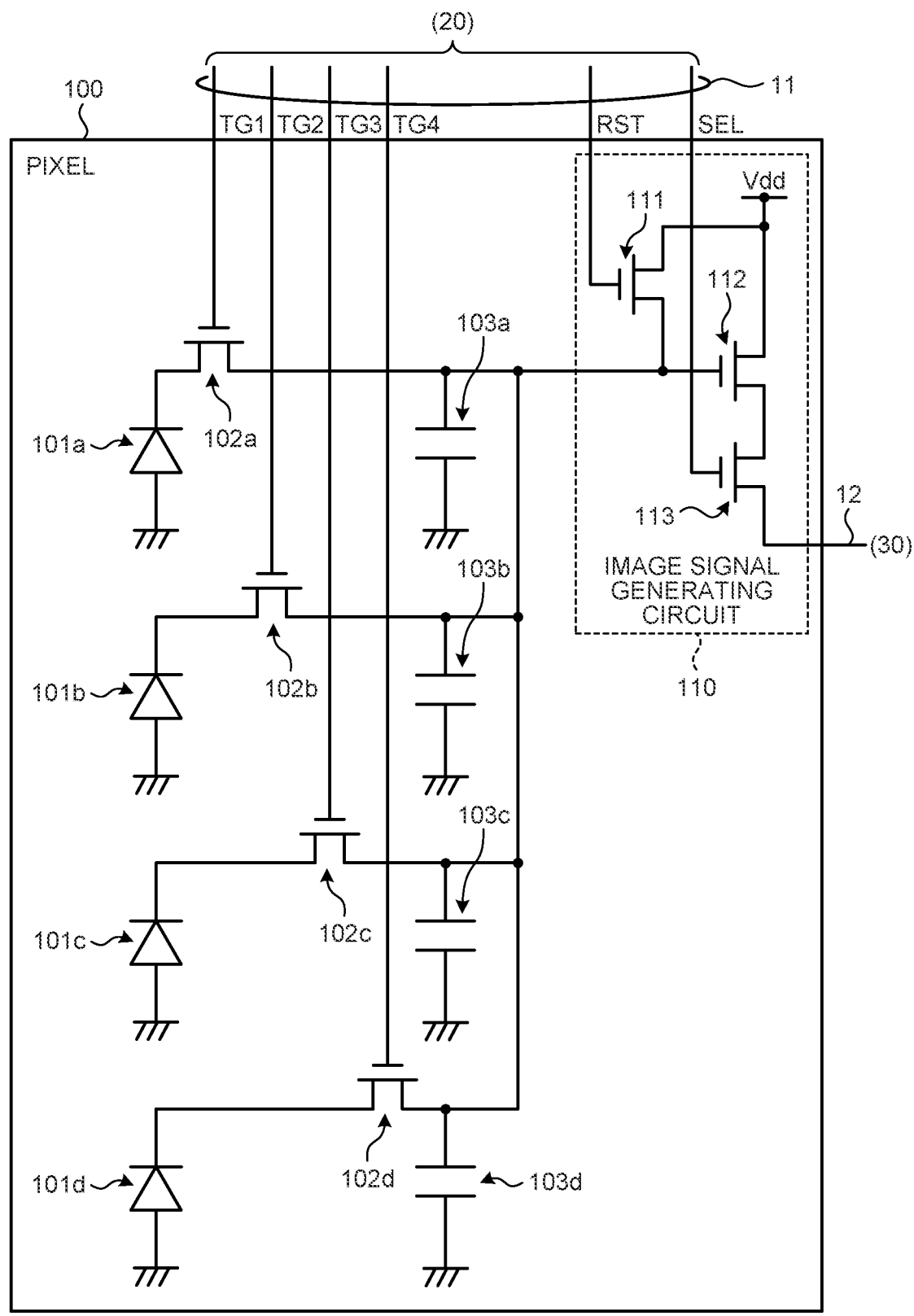
FIG. 20 is a diagram illustrating a configuration example of a pixel according to a fifth embodiment of the disclosure.

FIG. 20 is a diagram illustrating a configuration example of a pixel according to the fifth embodiment of the disclosure. The drawing is a circuit diagram illustrating a configuration example of a pixel 100 similarly to FIG. 2. The pixel 100 in the drawing is different from the pixel 100 in FIG. 2 in including four charge holding units.

The pixel 100 in the drawing includes charge holding units 103a, 103b, 103c, and 103d. The charge holding units 103a, 103b, 103c, and 103d hold charges transferred by charge transfer units 102a, 102b, 102c, and 102d, respectively. Note that the charge holding units 103a, 103b, 103c, and 103d are connected in parallel and connected to the same node.

Structure of Cross-Section of Pixel

Figure 21:
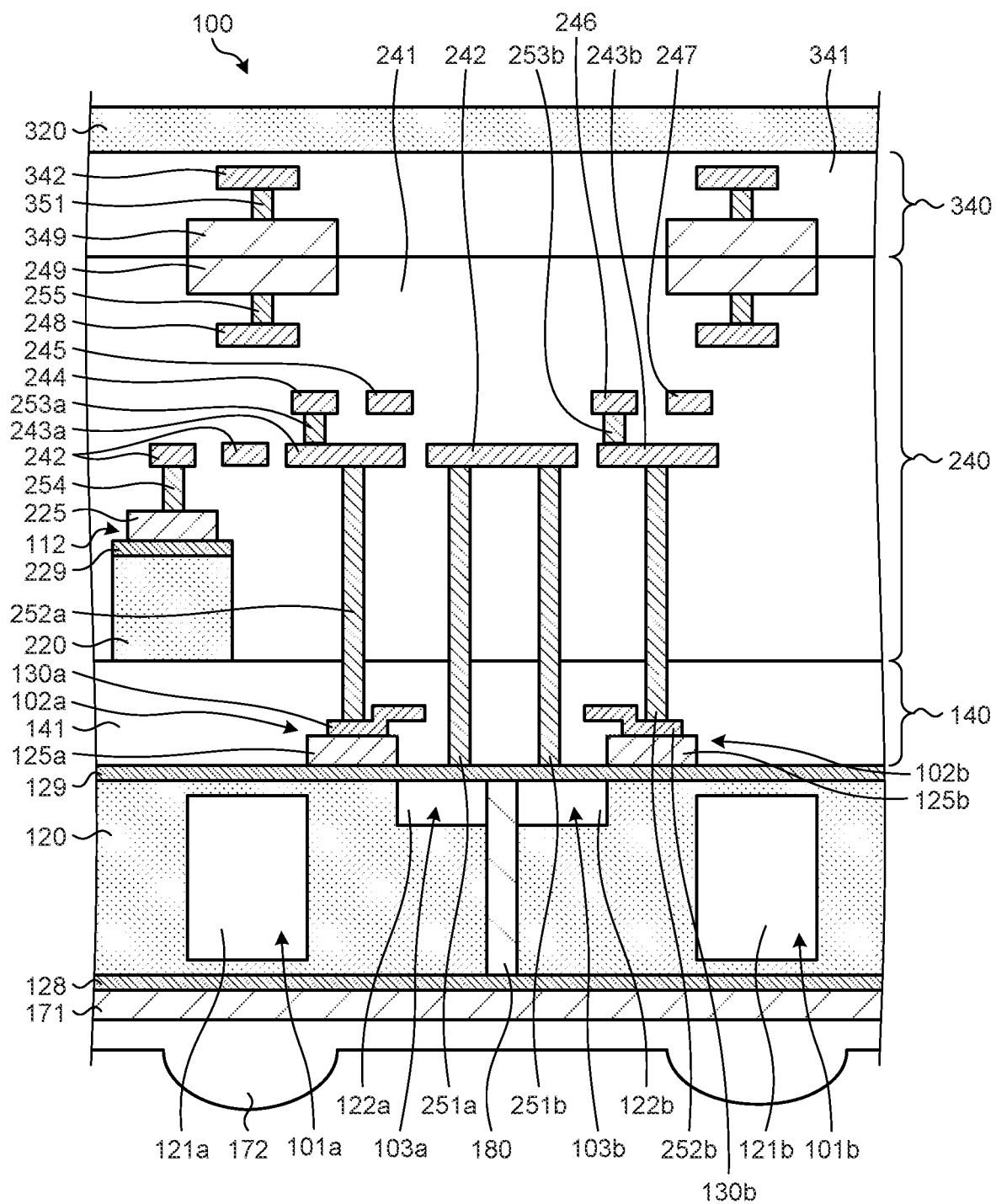
FIG. 21 is a cross-sectional view illustrating a structure example of a pixel according to the fifth embodiment of the disclosure.

FIG. 21 is a cross-sectional view illustrating a structure example of a pixel according to the fifth embodiment of the disclosure. The drawing is a cross-sectional view illustrating a structure example of a pixel 100 similarly to FIG. 4. The pixel 100 in the drawing is different from the pixel 100 in FIG. 4 in that charge holding units 103a and 103b are arranged instead of the charge holding unit 103.

In a semiconductor substrate 120 in the drawing, semiconductor regions 122a and 122b included in the charge holding units 103a and 103b are formed. These semiconductor regions are formed by dividing a single semiconductor region 122 into four by a separation unit 180. In this example, the separation unit 180 is obtained by embedding an insulating material in a groove portion penetrating the semiconductor substrate 120 formed from a back surface side of the semiconductor substrate 120 and separates the semiconductor region. Contact plugs 251a and 251b are connected to the semiconductor regions 122a and 122b, respectively. The contact plugs 251a and 251b are connected to wiring 242 in a shared manner. Capacitance adjustment units 130a and 130b in the drawing are arranged close to the contact plugs 251a and 251b, respectively, and adjust variations in the electrostatic capacitances 401.

The configuration of the imaging element 1 other than the above is similar to the configuration of the imaging element 1 in the first embodiment of the present disclosure, and thus description thereof is omitted.

As described above, in the imaging element 1 according to the fifth embodiment of the present disclosure, in a case where a plurality of charge holding units 103 is disposed in a pixel 100, it is possible to reduce variations in the charge transfer in a plurality of charge transfer units arranged in the pixel 100.

6. Application Examples to Imaging Device

The technology according to the present disclosure can be applied to various products. For example, the technology according to the disclosure can be applied to imaging devices such as cameras.

Figure 22:
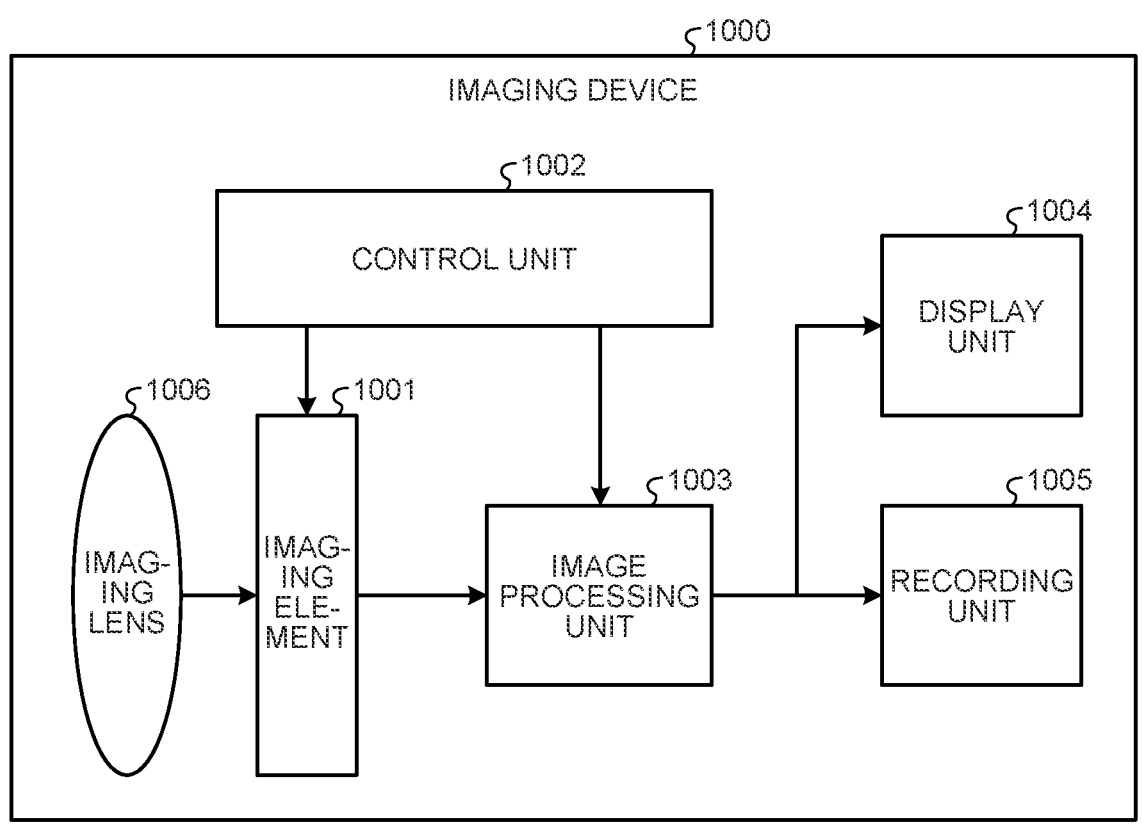
FIG. 22 is a diagram illustrating a configuration example of an imaging device to which the technology according to the disclosure can be applied.

FIG. 22 is a diagram illustrating an exemplary configuration of an imaging device to which the technology according to the disclosure can be applied. An imaging device 1000 in the drawing includes an imaging element 1001, a control unit 1002, an image processing unit 1003, a display unit 1004, a recording unit 1005, and an imaging lens 1006.

The imaging lens 1006 is a lens that collects light from a subject. The subject is imaged on a light receiving plane of the imaging element 1001 by the imaging lens 1006.

The imaging element 1001 captures an image of a subject. A plurality of pixels including a photoelectric conversion unit that performs photoelectric conversion of light from a subject is arranged on the light receiving plane of the imaging element 1001. Each of the plurality of pixels generates an image signal based on a charge generated by photoelectric conversion. The imaging element 1001 converts image signals generated by the pixels into digital image signals and outputs the digital image signals to the image processing unit 1003. Note that image signals for one screen are referred to as a frame. The imaging element 1001 can also output image signals frame by frame.

The control unit 1002 controls the imaging element 1001 and the image processing unit 1003. The control unit 1002 can include, for example, an electronic circuit using a microcomputer or the like.

The image processing unit 1003 processes an image signal from the imaging element 1001. The processing of an image signal in the image processing unit 1003 corresponds to, for example, demosaic processing of generating an image signal of a color that is insufficient when a color image is generated or noise reduction processing of removing noise of the image signal. The image processing unit 1003 can include, for example, an electronic circuit using a microcomputer or the like.

The display unit 1004 displays an image on the basis of the image signals processed by the image processing unit 1003. The display unit 1004 can include, for example, a liquid crystal monitor.

The recording unit 1005 records an image (frame) based on the image signals processed by the image processing unit 1003. The recording unit 1005 can include, for example, a hard disk or a semiconductor memory.

The imaging device to which the present disclosure can be applied has been described above. The present technology can be applied to the imaging element 1001 among the above-described components. Specifically, the imaging element 1 described in FIG. 1 can be applied to the imaging element 1001. Note that the imaging element 1001 is an example of the imaging element described in the claims. Moreover, that the image processing unit 1003 is an example of the processing circuit described in the claims. Furthermore, the imaging device 1000 is an example of the imaging device described in the claims.

Note that the configuration of the fifth embodiment of the present disclosure can be applied to other embodiments. Specifically, the configuration of the pixel 100 including the charge holding units 103a, 103b, 103c, and 103d in FIG. 20 can be applied to the second to fourth embodiments of the present disclosure.

Effects

An imaging element 1 includes a plurality of photoelectric conversion units 101, a plurality of charge transfer units 102, an image signal generating circuit 110, charge transfer unit signal lines 161, a charge holding unit signal line 162, and a capacitance adjustment unit 130. A photoelectric conversion unit 101 is disposed in a semiconductor substrate 120 in which a wiring region 140 is formed on a front surface side and performs photoelectric conversion of incident light to generate a charge. A charge holding unit 103 is disposed on the semiconductor substrate 120 and holds the generated charge. A charge transfer unit 102 is disposed for each of the photoelectric conversion units 101 and transfers the generated charge to the charge holding unit 103. The image signal generating circuit 110 is disposed in the semiconductor substrate 220 stacked on the semiconductor substrate 120 on a back surface side with a wiring region 240 formed on the front surface side and generates an image signal on the basis of the held charge. A charge transfer unit signal line 161 includes wiring disposed in the wiring region 240 and wiring disposed in the wiring region 140 and is disposed for each of the plurality of charge transfer units 102 to transmit a control signal. The charge holding unit signal line 162 includes wiring arranged in the wiring region 240 and wiring arranged in the wiring region 140 and transmits a voltage corresponding to the charge held in the charge holding unit 103 to the image signal generating circuit 110. The capacitance adjustment unit 130 is disposed in the vicinity of at least one of the plurality of charge transfer unit signal lines 161 and the charge holding unit signal line 162 in the wiring region 140 and adjusts an electrostatic capacitance between the charge transfer unit signal line 161 and the charge holding unit signal line 162. As a result, the wiring capacitance of a control signal disposed in a pixel 100 can be adjusted.

Furthermore, the charge holding unit 103 may be arranged for each of the plurality of photoelectric conversion units 101, and the plurality of charge transfer units 102 may transfer the generated charges to the respective charge holding units 103. As a result, it is possible to adjust the electrostatic capacitance between a charge transfer unit signal line 161 and a charge holding unit signal line 162 of a charge holding unit 103 disposed for each of the photoelectric conversion units 101.

Furthermore, the capacitance adjustment unit 130 may be connected to a charge transfer unit signal line 161. As a result, the electrostatic capacitance with the charge holding unit signal line 162 can be adjusted by the capacitance adjustment unit 130 connected to the charge transfer unit signal line 161.

Furthermore, the capacitance adjustment unit 130 may be disposed adjacent to a gate electrode of a MOS transistor included in a charge transfer unit 102.

Furthermore, the capacitance adjustment unit 130 may be connected to the charge holding unit signal line 162.

Alternatively, the capacitance adjustment unit 130 may be disposed in such a manner as to be insulated from the charge transfer unit signal lines 161 and the charge holding unit signal line 162. Accordingly, connection with the capacitance adjustment unit 130 can be omitted.

In addition, the capacitance adjustment unit 130 may be made of a conductor. As a result, the electrostatic capacitance between the charge holding unit signal line 162 and the charge transfer unit signal line 161 can be adjusted by adjusting the shape of the capacitance adjustment unit 130.

In addition, the capacitance adjustment unit may have a dielectric constant different from that of an insulating layer disposed in the first wiring region. As a result, the electrostatic capacitance between the charge holding unit signal line 162 and the charge transfer unit signal line 161 can be adjusted by adjusting the dielectric constant of the capacitance adjustment unit 130.

Incidentally, the capacitance adjustment unit may be made of silicon. This makes it possible to apply a high-temperature process in the manufacturing steps.

An imaging element 1 includes a plurality of photoelectric conversion units 101, a plurality of charge transfer units 102, an image signal generating circuit 110, charge transfer unit signal lines 161, a charge holding unit signal line 162, a capacitance adjustment unit 130, and a control signal generating circuit (vertical drive unit 20). A photoelectric conversion unit 101 is disposed in a semiconductor substrate 120 in which a wiring region 140 is formed on a front surface side and performs photoelectric conversion of incident light to generate a charge. A charge holding unit 103 is disposed on the semiconductor substrate 120 and holds the generated charge. A charge transfer unit 102 is disposed for each of the photoelectric conversion units 101 and transfers the generated charge to the charge holding unit 103. The image signal generating circuit 110 is disposed in the semiconductor substrate 220 stacked on the semiconductor substrate 120 on a back surface side with a wiring region 240 formed on the front surface side and generates an image signal on the basis of the held charge. A charge transfer unit signal line 161 includes wiring disposed in the wiring region 240 and wiring disposed in the wiring region 140 and is disposed for each of the plurality of charge transfer units 102 to transmit a control signal. The charge holding unit signal line 162 includes wiring arranged in the wiring region 240 and wiring arranged in the wiring region 140 and transmits a voltage corresponding to the charge held in the charge holding unit 103 to the image signal generating circuit 110. The capacitance adjustment unit 130 is disposed in the vicinity of at least one of the plurality of charge transfer unit signal lines 161 and the charge holding unit signal line 162 in the wiring region 140 and adjusts an electrostatic capacitance between the charge transfer unit signal line 161 and the charge holding unit signal line 162. The control signal generating circuit (vertical drive unit 20) generates the control signal and outputs the control signal to the charge transfer unit signal line. As a result, the wiring capacitance of a control signal disposed in a pixel 100 can be adjusted.

Note that the effects described herein are merely examples and are not limited, and other effects may also be achieved.

Note that the present technology can also have the following configurations.

(1)

An imaging element comprising:
a plurality of photoelectric conversion units that performs photoelectric conversion of incident light and generates a charge, the plurality of photoelectric conversion units arranged in a first semiconductor substrate having a first wiring region formed on a front surface side;

a charge holding unit that holds the generated charges, the charge holding unit disposed in the first semiconductor substrate;

a plurality of charge transfer units that transfers the generated charges to the charge holding unit, the plurality of charge transfer units each disposed for one of the photoelectric conversion units;

an image signal generating circuit that generates an image signal on a basis of the held charge, the image signal generating circuit disposed in a second semiconductor substrate stacked on the first semiconductor substrate on a back surface side with a second wiring region formed on a front surface side;

a plurality of charge transfer unit signal lines that each transmits a control signal, the plurality of charge transfer unit signal lines comprising wiring disposed in the second wiring region and wiring disposed in the first wiring region, the plurality of charge transfer unit signal lines each disposed for one of the plurality of charge transfer units;

a charge holding unit signal line that transmits a voltage corresponding to a charge held in the charge holding unit to the image signal generating circuit, the charge holding unit signal line comprising wiring disposed in the second wiring region and wiring disposed in the first wiring region; and a capacitance adjustment unit that is disposed in a vicinity of at least one of the plurality of charge transfer unit signal lines and the charge holding unit signal line in the first wiring region and adjusts an electrostatic capacitance between the charge transfer unit signal line and the charge holding unit signal line.

(2)

The imaging element according to the above (1), wherein the charge holding unit is disposed for each of the plurality of photoelectric conversion units, and the plurality of charge transfer units transfers the generated respective charges to the respective charge holding units.

(3)

The imaging element according to the above (1) or (2), wherein the capacitance adjustment unit is connected to a charge transfer unit signal line.

(4)

The imaging element according to the above (3), wherein the capacitance adjustment unit is disposed adjacent to a gate electrode of a MOS transistor comprised in the charge transfer unit.

(5)

The imaging element according to the above (1) or (2), wherein the capacitance adjustment unit is connected to the charge holding unit signal line.

(6)

The imaging element according to the above (1) or (2), wherein the capacitance adjustment unit is disposed in such a manner as to be insulated from the charge transfer unit signal lines and the charge holding unit signal line.

(7)

The imaging element according to the above (6), wherein the capacitance adjustment unit is made of a conductor.

(8)

The imaging element according to the above (6), wherein the capacitance adjustment unit has a dielectric constant different from a dielectric constant of an insulating layer disposed in the first wiring region.

(9)

The imaging element according to any one of the above (1) to (8), wherein the capacitance adjustment unit is made of silicon.

(10)

An imaging device comprising:

a plurality of photoelectric conversion units that performs photoelectric conversion of incident light and generates a charge, the plurality of photoelectric conversion units arranged in a first semiconductor substrate having a first wiring region formed on a front surface side;

a charge holding unit that holds the generated charges, the charge holding unit disposed in the first semiconductor substrate;

a plurality of charge transfer units that transfers the generated charges to the charge holding unit, the plurality of charge transfer units each disposed for one of the photoelectric conversion units;

an image signal generating circuit that generates an image signal on a basis of the held charge, the image signal generating circuit disposed in a second semiconductor substrate stacked on the first semiconductor substrate on a back surface side with a second wiring region formed on a front surface side;

a plurality of charge transfer unit signal lines that each transmits a control signal, the plurality of charge transfer unit signal lines comprising wiring disposed in the second wiring region and wiring disposed in the first wiring region, the plurality of charge transfer unit signal lines each disposed for one of the plurality of charge transfer units;

a charge holding unit signal line that transmits a voltage corresponding to a charge held in the charge holding unit to the image signal generating circuit, the charge holding unit signal line comprising wiring disposed in the second wiring region and wiring disposed in the first wiring region;

a capacitance adjustment unit that is disposed in a vicinity of at least one of the plurality of charge transfer unit signal lines and the charge holding unit signal line in the first wiring region and adjusts an electrostatic capacitance between the charge transfer unit signal line and the charge holding unit signal line; and a control signal generating circuit that generates the control signals and outputs the control signals to the charge transfer unit signal lines.

(11)

The imaging device according to the above (10), further comprising a processing circuit that processes the image signal.

REFERENCE SIGNS LIST 1, 1001 IMAGING ELEMENT
10 PIXEL ARRAY UNIT
20 VERTICAL DRIVE UNIT
30 COLUMN SIGNAL PROCESSING UNIT
100 PIXEL
101, 101a, 101b, 101c, 101d PHOTOELECTRIC CONVERSION UNIT
102, 102a, 102b, 102c, 102d CHARGE TRANSFER UNIT
103, 103a, 103b, 103c, 103d CHARGE HOLDING UNIT
110 IMAGE SIGNAL GENERATING CIRCUIT
120, 220, 320 SEMICONDUCTOR SUBSTRATE
130, 130a, 130b, 130c, 130d CAPACITANCE ADJUSTMENT UNIT
140, 240, 340 WIRING REGION 141, 241, 341 INSULATING LAYER
150, 160 CAPACITANCE ADJUSTMENT UNIT
161 CHARGE TRANSFER UNIT SIGNAL LINE
162 CHARGE HOLDING UNIT SIGNAL LINE
180 SEPARATION UNIT
242, 243a, 243b, 244 to 248, 342 WIRING
251, 251a, 251b, 252, 252a, 252b, 254, 259 CONTACT PLUG
253, 253a, 253b, 255, 351 VIA PLUG
1000 IMAGING DEVICE
1003 IMAGE PROCESSING UNIT

The invention claimed is:

1. An imaging element comprising:
a plurality of photoelectric conversion units that performs photoelectric conversion of incident light and generates a charge, the plurality of photoelectric conversion units arranged in a first semiconductor substrate having a first wiring region formed on a front surface side;
a charge holding unit that holds the generated charges, the charge holding unit disposed in the first semiconductor substrate;
a plurality of charge transfer units that transfers the generated charges to the charge holding unit, the plurality of charge transfer units each disposed for one of the photoelectric conversion units;
an image signal generating circuit that generates an image signal on a basis of the held charge, the image signal generating circuit disposed in a second semiconductor substrate stacked on the first semiconductor substrate on a back surface side with a second wiring region formed on a front surface side;
a plurality of charge transfer unit signal lines that each transmits a control signal, the plurality of charge transfer unit signal lines comprising wiring disposed in the second wiring region and wiring disposed in the first wiring region, the plurality of charge transfer unit signal lines each disposed for one of the plurality of charge transfer units;
a charge holding unit signal line that transmits a voltage corresponding to the charge held in the charge holding unit to the image signal generating circuit, the charge holding unit signal line comprising wiring disposed in the second wiring region and wiring disposed in the first wiring region; and
a capacitance adjustment unit that is disposed in a vicinity of at least one of the plurality of charge transfer unit signal lines and the charge holding unit signal line in the first wiring region and adjusts an electrostatic capacitance between the charge transfer unit signal line and the charge holding unit signal line.

2. The imaging element according to claim 1,
wherein the charge holding unit is disposed for each of the plurality of photoelectric conversion units, and
the plurality of charge transfer units transfers the generated respective charges to the respective charge holding units.

3. The imaging element according to claim 1, wherein the capacitance adjustment unit is connected to a charge transfer unit signal line.

4. The imaging element according to claim 3, wherein the capacitance adjustment unit is disposed adjacent to a gate electrode of a MOS transistor comprised in a charge transfer unit of the plurality of charge transfer units.

5. The imaging element according to claim 1, wherein the capacitance adjustment unit is connected to the charge holding unit signal line.

6. The imaging element according to claim 1, wherein the capacitance adjustment unit is disposed in such a manner as to be insulated from the charge transfer unit signal lines and the charge holding unit signal line.

7. The imaging element according to claim 6, wherein the capacitance adjustment unit is made of a conductor.

8. The imaging element according to claim 6, wherein the capacitance adjustment unit has a dielectric constant different from a dielectric constant of an insulating layer disposed in the first wiring region.

9. The imaging element according to claim 1, wherein the capacitance adjustment unit is made of silicon.

10. An imaging device comprising:
a plurality of photoelectric conversion units that performs photoelectric conversion of incident light and generates a charge, the plurality of photoelectric conversion units arranged in a first semiconductor substrate having a first wiring region formed on a front surface side;
a charge holding unit that holds the generated charges, the charge holding unit disposed in the first semiconductor substrate;
a plurality of charge transfer units that transfers the generated charges to the charge holding unit, the plurality of charge transfer units each disposed for one of the photoelectric conversion units;
an image signal generating circuit that generates an image signal on a basis of the held charge, the image signal generating circuit disposed in a second semiconductor substrate stacked on the first semiconductor substrate on a back surface side with a second wiring region formed on a front surface side;
a plurality of charge transfer unit signal lines that each transmits a control signal, the plurality of charge transfer unit signal lines comprising wiring disposed in the second wiring region and wiring disposed in the first wiring region, the plurality of charge transfer unit signal lines each disposed for one of the plurality of charge transfer units;
a charge holding unit signal line that transmits a voltage corresponding to the charge held in the charge holding unit to the image signal generating circuit, the charge holding unit signal line comprising wiring disposed in the second wiring region and wiring disposed in the first wiring region;
a capacitance adjustment unit that is disposed in a vicinity of at least one of the plurality of charge transfer unit signal lines and the charge holding unit signal line in the first wiring region and adjusts an electrostatic capacitance between the charge transfer unit signal line and the charge holding unit signal line; and
a control signal generating circuit that generates the control signals and outputs the control signals to the charge transfer unit signal lines.

11. The imaging device according to claim 10, further comprising a processing circuit that processes the image signal.

* * * * *